United States Patent
Okuno

(10) Patent No.: US 7,249,343 B2
(45) Date of Patent: Jul. 24, 2007

(54) IN-PLANE DISTRIBUTION DATA COMPRESSION METHOD, IN-PLANE DISTRIBUTION MEASUREMENT METHOD, IN-PLANE DISTRIBUTION OPTIMIZATION METHOD, PROCESS APPARATUS CONTROL METHOD, AND PROCESS CONTROL METHOD

(75) Inventor: Yasutoshi Okuno, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 209 days.

(21) Appl. No.: 10/891,112

(22) Filed: Jul. 15, 2004

(65) Prior Publication Data

US 2005/0015736 A1   Jan. 20, 2005

(30) Foreign Application Priority Data

Jul. 15, 2003   (JP)   ............................. 2003-197153

(51) Int. Cl.
- *G06F 17/50* (2006.01)
- *G06F 19/00* (2006.01)
- *G06K 9/00* (2006.01)

(52) U.S. Cl. .................... 716/21; 700/121; 382/144
(58) Field of Classification Search ................ 700/121; 716/1, 21; 382/144–145; 430/30

See application file for complete search history.

(56) References Cited

U.S. PATENT DOCUMENTS

| | | | |
|---|---|---|---|
| 6,742,168 B1* | 5/2004 | Nariman ........................ 716/4 |
| 6,751,518 B1* | 6/2004 | Sonderman et al. ........ 700/121 |
| 6,826,491 B2* | 11/2004 | Jachim ........................ 702/42 |
| 2002/0193899 A1* | 12/2002 | Shanmugasundram et al. .......................... 700/108 |
| 2003/0229410 A1* | 12/2003 | Smith et al. ................ 700/109 |
| 2005/0084987 A1* | 4/2005 | Wilson et al. ................. 438/5 |

FOREIGN PATENT DOCUMENTS

JP     2002-184733 A     6/2002

* cited by examiner

*Primary Examiner*—Stacy A Whitmore
(74) *Attorney, Agent, or Firm*—McDermott Will & Emery LLP

(57) ABSTRACT

After a process is performed on a substrate, the in-plane distribution over the substrate is measured. Measured data of the in-plane distribution which is obtained by the measurement is stored. A model formula of the in-plane distribution is calculated from the stored measured data. The measured data is compared with the model formula. A set of parameters of the model formula is calculated, and the calculated parameters are stored as data of the in-plane distribution over the substrate. The measured data includes measurement coordinates over the substrate. The model formula is obtained by modeling the tendency that the in-plane distribution concentrically varies and the tendency that the in-plane distribution varies along a diameter direction.

15 Claims, 24 Drawing Sheets

FIG. 5
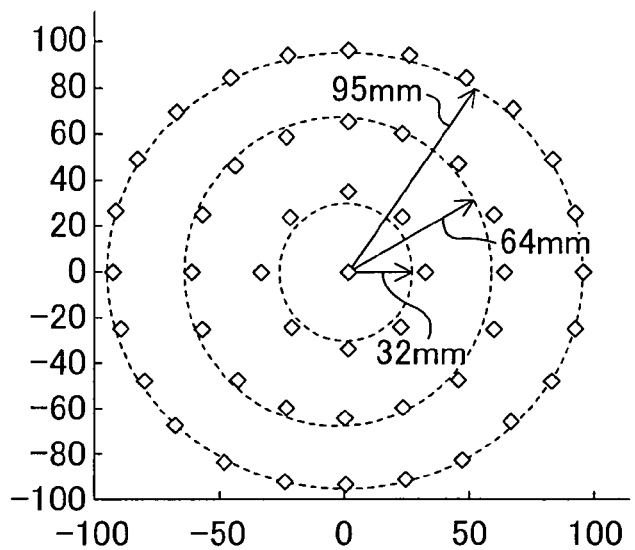
FIG. 6
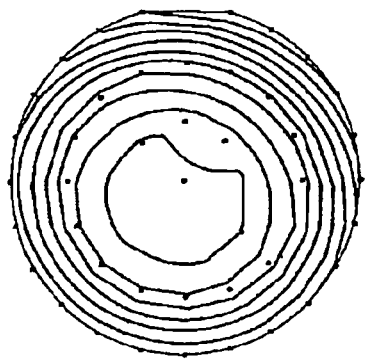
FIG. 7
| Radius | Average | MAX | MIN | Standard deviation |
|---|---|---|---|---|
| 0 | 17.21 | 17.21 | 17.21 | – |
| 32 | 17.35 | 17.49 | 17.22 | 0.11 |
| 64 | 17.75 | 18.08 | 17.53 | 0.21 |
| 95 | 18.83 | 21.13 | 18.45 | 0.57 |

| point | r | θ |
|---|---|---|
| 1 | 0 | 0 |
| 2 | 33 | 90 |
| 3 | 33 | 135 |
| 4 | 33 | 180 |
| 5 | 33 | 225 |
| 6 | 33 | 270 |
| 7 | 33 | 315 |
| 8 | 33 | 0 |
| 9 | 33 | 45 |
| 10 | 66 | 90 |
| 11 | 66 | 135 |
| 12 | 66 | 180 |
| 13 | 66 | 225 |
| 14 | 66 | 270 |
| 15 | 66 | 315 |
| 16 | 66 | 0 |
| 17 | 66 | 45 |
| 18 | 97 | 90 |
| 19 | 97 | 135 |
| 20 | 97 | 180 |
| 21 | 97 | 225 |
| 22 | 97 | 270 |
| 23 | 97 | 315 |
| 24 | 97 | 0 |
| 25 | 97 | 45 |

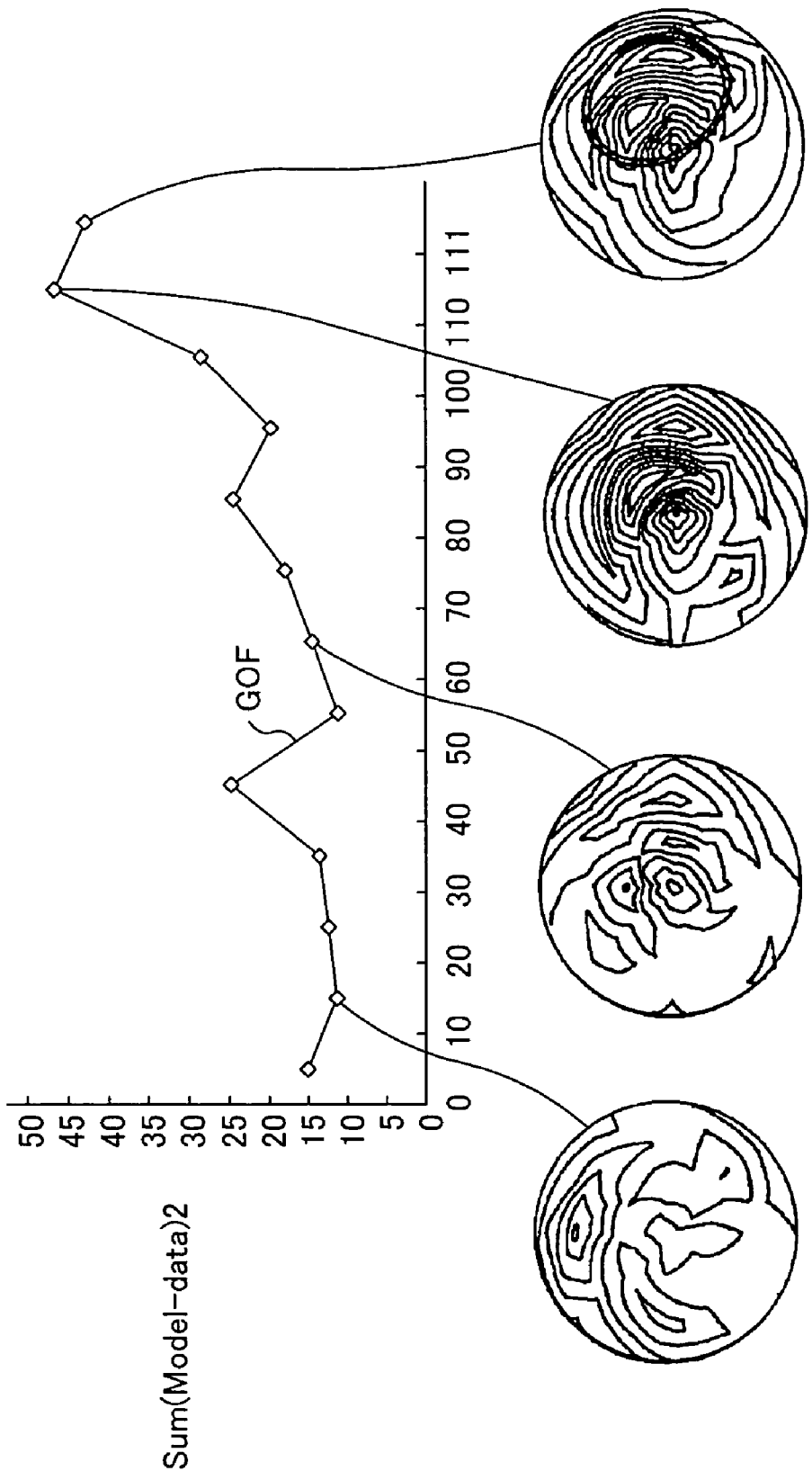

IN-PLANE DISTRIBUTION DATA COMPRESSION METHOD, IN-PLANE DISTRIBUTION MEASUREMENT METHOD, IN-PLANE DISTRIBUTION OPTIMIZATION METHOD, PROCESS APPARATUS CONTROL METHOD, AND PROCESS CONTROL METHOD

CROSS-REFERENCE TO RELATED APPLICATION

This application is related to Japanese Patent Application No. 2003-197153 filed on Jul. 15, 2003 and Japanese Patent Application No. 2004-185033 filed on Jun. 23, 2004, whose priorities are claimed under 35 USC §119, the disclosures of which are incorporated by reference in their entirety.

BACKGROUND OF THE INVENTION

1. Field of the Invention

The present invention relates to the in-plane uniformity of a semiconductor substrate after a step of processes in the production of a semiconductor device. Specifically, the present invention relates to an in-plane distribution data compression method, an in-plane distribution measurement method, an in-plane distribution optimization method, a process apparatus control method, and a process control method.

2. Description of the Prior Art

Japanese Unexamined Patent Publication No. 2002-184733 discloses a conventional measurement method, which is described herein with reference to the flowchart of FIG. 30.

The measurement method comprises the steps of: performing a first process on a first substrate; and performing a second process on the first substrate or a second substrate, wherein a correlation function for each of in-plane positions is obtained as data of the difference among a plurality of process steps for each of in-plane positions based on the in-plane distribution data for the in-plane position on each of the substrates which are the results of the plurality of processes, the in-plane distribution characteristics of the substrate under a desired process condition is calculated from the correlation function, and the substrate is processed based on the in-plane distribution characteristics.

In the conventional measurement method, one-dimensional measurement is performed to evaluate the distribution from the wafer center to the wafer edge. This has been commonly conducted because of an empirical fact that the in-plane distribution exhibits a substantially concentric distribution. Another reason for the one-dimensional measurement is that, in the case of two-dimensional evaluation, it is necessary to quadratically increase the number of evaluation points as the radius of the substrate increases, which is not required in the one-dimensional evaluation. Thus, in the conventional method, it is necessary to select fine one-dimensional (linear) measurement or rough two-dimensional measurement according to the purpose of measurement. In the case of one-dimensional measurement, even if the in-plane distribution is concentric, the center of concentric circles is off the center of the substrate in many cases. Therefore, accurate evaluation cannot be achieved.

In the case where two-dimensional measurement is carried out for the purpose of accurate evaluation, the measurement has to be conducted at an enormous number of measurement points and accordingly requires an enormous length of time. Furthermore, it is necessary to store an enormous amount of data resulting from the measurement, and therefore, a large capacity storage device is required.

SUMMARY OF THE INVENTION

In order to solve the problems in the conventional techniques, the first invention is directed to an in-plane distribution data compression method used in a production process of a semiconductor device, comprising the steps of: performing a process over a substrate; measuring an in-plane distribution over the substrate; calculating a model formula of the in-plane distribution from measurement data obtained by the measurement; comparing the measurement data with the model formula to calculate a set of parameters of the model formula; and storing the parameters as data of the in-plane distribution over the substrate, wherein the measurement data includes measurement coordinates over the substrate, and the model formula is obtained by modeling the tendency that the in-plane distribution concentrically varies and the tendency that the in-plane distribution varies along a diameter direction.

In the present specification, performing a process over a substrate means performing a set of process sequences to physically or chemically modify a silicon wafer to be able to send it to the next process step. Examples of such process sequences include dielectric deposition, wet etching, dry etching, metal deposition, anneal process, oxidation process, CMP, photolithography, etc. The in-plane distribution over a substrate means an in-plane distribution which represents the distribution of a physical parameter over the substrate, such as film thickness, gate length, reflectivity, or the like. The model formula of the in-plane distribution means a formula including coefficients wherein the in-plane measurement position is provided as a variable. The parameters of the model formula mean the above coefficients. Storing the parameters as data of the in-plane distribution over the substrate means storing the parameters as distribution data which represents the in-plane distribution over the substrate.

In the above structure of the present invention, the in-plane distribution over a semiconductor substrate is modeled in consideration of the two tendencies that the in-plane distribution concentrically varies and the in-plane distribution varies along the diameter direction. Specifically, the in-plane distribution is modeled in consideration of the following conditions. The in-plane distribution over the substrate has a tendency to be "concentric" due to the shape of a chamber of a semiconductor substrate process apparatus. A process apparatus (which is relatively provided with respect to a wafer to be processed) has an avoidable small "tilt" (for example, in the parallelism of a source gas supply shower head facing to a wafer holder of the apparatus, the parallelism between a sputter target and a wafer in a PVD process, or the like), which is a defect ascribed to the apparatus itself. The concentric distribution is deformed to an elliptic shape due to an influence of an exhaustion port and/or other unperfect radially-symmetrical shape of a process chamber. The centers of concentric circles are offset due to the position accuracy of the wafer on the wafer holder. Then, measured values at a plurality of predetermined measurement points over the substrate surface are applied to the model formula to obtain coefficients (parameters) of the model formula which are necessary for reproducing the in-plane distribution, and only the model formula and the parameters are stored. When data of a semiconductor substrate which has been processed before, such as data about the process control, or the like, is referred to, the in-plane distribution of each semiconductor substrate in each step of the semiconductor device production process can be reproduced from the stored model formula and parameters.

According to the present invention, the in-plane distribution over the semiconductor substrate can be reproduced only with the model formula and the parameters, i.e., only with a very small amount of data as compared with reproduction of the in-plane distribution with a large amount of measured values. Thus, it is not necessary to increase the capacity of a data storage incorporated in a measurement device. Accordingly, the size of the measurement device is decreased.

The second invention is directed to a process control method used in a production process of a semiconductor device, comprising the steps of: performing a process over a substrate; measuring an in-plane distribution over the substrate; calculating a model formula of the in-plane distribution from measurement data obtained by measurement; comparing the measurement data with the model formula to calculate a set of parameters of the model formula; storing the parameters as data of the in-plane distribution over the substrate; and determining an abnormality in a semiconductor device production apparatus from a variation in the stored parameters, wherein the measurement data includes measurement coordinates over the substrate, and the model formula is obtained by modeling the tendency that the in-plane distribution concentrically varies and the tendency that the in-plane distribution varies along a diameter direction.

In the above structure of the present invention, the in-plane distribution over a semiconductor substrate is modeled in consideration of the two tendencies that the in-plane distribution concentrically varies and the in-plane distribution varies along the diameter direction. Specifically, the in-plane distribution is modeled in consideration of the following circumstances. The in-plane distribution over the substrate has a tendency to be "concentric" due to the shape of a chamber of a semiconductor substrate process apparatus. A process apparatus which is relatively provided with respect to a wafer to be processed has an avoidable small "tilt" (for example, in the parallelism of a source gas supply shower head facing to a wafer holder of the apparatus, the parallelism between a sputter target and a wafer in a PVD process, or the like), which is a defect ascribed to the apparatus itself. The concentric distribution is deformed to an elliptic shape due to an influence of an exhaustion port and/or other unperfect radially-symmetrical shape of a process chamber. The centers of concentric circles are offset due to the position accuracy of the wafer on the wafer holder. Then, measured values at a plurality of predetermined measurement points over the substrate surface are applied to the model formula to obtain coefficients (parameters) of the model formula which are necessary for reproducing the in-plane distribution, and only the model formula and the parameters are stored. The variation tendency is quantitatively evaluated based on some parameters stored for a semiconductor substrate which has been processed before, e.g., parameters for the process control, or the like, whereby an abnormality in the apparatus can be estimated before occurrence of a defect.

The third invention is directed to an in-plane distribution measurement method used in a production process of a semiconductor device, comprising the steps of: performing a process over a substrate; measuring an in-plane distribution over the substrate; calculating a model formula of the in-plane distribution from measurement data obtained by measurement; comparing the measurement data with the model formula to calculate a set of parameters of the model formula; storing the parameters as data of the in-plane distribution over the substrate; comparing the measurement data with the model formula to detect measurement data which is inconsistent with the model formula; and performing remeasurement for the inconsistent measurement data to update the inconsistent measurement data, wherein the measurement data includes measurement coordinates over the substrate, and the model formula is obtained by modeling the tendency that the in-plane distribution concentrically varies and the tendency that the in-plane distribution varies along a diameter direction.

In the above structure of the present invention, the in-plane distribution over a semiconductor substrate is modeled in consideration of the two tendencies that the in-plane distribution concentrically varies and the in-plane distribution varies along the diameter direction. Specifically, the in-plane distribution is modeled in consideration of the following circumstances. The in-plane distribution over the substrate has a tendency to be "concentric" due to the shape of a chamber of a semiconductor substrate process apparatus. A process apparatus which is relatively provided with respect to a wafer to be processed has an avoidable small "tilt" (for example, in the parallelism of a source gas supply shower head facing to a wafer holder of the apparatus, the parallelism between a sputter target and a wafer in a PVD process, or the like), which is a defect ascribed to the apparatus itself. The concentric distribution is deformed to an elliptic shape due to an influence of an exhaustion port and/or other unperfect radially-symmetrical shape of a process chamber. The centers of concentric circles are offset due to the position accuracy of the wafer on the wafer holder. Then, measured values at a plurality of predetermined measurement points over the substrate surface are applied to the model formula to obtain coefficients (parameters) of the model formula which are necessary for reproducing the in-plane distribution, and only the model formula and the parameters are stored. Then, remeasurement is performed at a measurement point (singular point) at which a residual error component between the in-plane distribution reproduced from the model formula (fitting value) and the in-plane distribution of measured values (the difference between the fitting value and the measured value at each measurement point) is large. Then, the average value of the previously-measured value and the remeasured value is obtained and used as data of the singular point, whereby the measurement accuracy is improved.

The fourth invention is directed to an in-plane distribution optimization method used in a production process of a semiconductor device, comprising the steps of: performing a first process over a substrate; measuring an in-plane distribution A over the substrate; calculating a model formula A of the in-plane distribution A from measurement data A obtained by measurement; comparing the measurement data A with the model formula A to calculate a set of parameters A of the model formula A; storing the parameters A as data A of the in-plane distribution A over the substrate; performing a second process over the substrate; measuring an in-plane distribution B over the substrate; calculating a model formula B of the in-plane distribution B from measurement data B obtained by measurement; comparing the measurement data B with the model formula B to calculate a set of parameters B of the model formula B; storing the parameters B as data B of the in-plane distribution B over the substrate; and comparing the in-plane distribution A and the in-plane distribution B based on the data A and the data B to calculate a correction value such that the uniformity of the in-plane distribution B in the second process improves, wherein the measurement data A and the measurement data B include measurement coordinates over the substrate, and the model formula A and the model formula B are obtained by modeling the tendency that the in-plane distribution A and the in-plane distribution B concentrically vary and the tendency that the in-plane distribution A and the in-plane distribution B vary along a diameter direction.

In the above structure of the present invention, the in-plane distribution over a semiconductor substrate is modeled in consideration of the two tendencies that the in-plane distribution concentrically varies and the in-plane distribution varies along the diameter direction. Specifically, the in-plane distribution is modeled in consideration of the following circumstances. The in-plane distribution over the substrate has a tendency to be "concentric" due to the shape of a chamber of a semiconductor substrate process apparatus. A process apparatus which is relatively provided with respect to a wafer to be processed has an avoidable small "tilt" (for example, in the parallelism of a source gas supply shower head facing to a wafer holder of the apparatus, the parallelism between a sputter target and a wafer in a PVD process, or the like), which is a defect ascribed to the apparatus itself. The concentric distribution is deformed to an elliptic shape due to an influence of an exhaustion port and/or other unperfect radially-symmetrical shape of a process chamber. The centers of concentric circles are offset due to the position accuracy of the wafer on the wafer holder. Then, measured values at a plurality of predetermined measurement points over the substrate surface are applied to the model formula to obtain coefficients (parameters) of the model formula which are necessary for reproducing the in-plane distribution, and only the model formula and the parameters are stored. The data of the in-plane distributions are acquired through the first and second processes. Then, the process conditions are corrected such that the in-plane distributions become more uniform when the tendencies of bias in the in-plane distributions of the first and second processes are superposed with each other. Therefore, a subsequent semiconductor substrate is processed with higher in-plane uniformity. In a specific example of the correction method, the in-plane distribution obtained when the position of the orientation flat of a semiconductor substrate is rotated by θ degree is calculated. Then, an optimum angle is obtained such that a variation in the in-plane distribution obtained when the wafer is rotated by θ degree becomes minimum, whereby the degree of variation in the in-plane distribution between the first process and the second process is minimized. As a result, the in-plane distribution which has undergone the first and second processes is optimized.

The fifth invention is directed to a process apparatus control method used in a production process of a semiconductor device, comprising the steps of: performing a process over a substrate; measuring an in-plane distribution over the substrate; calculating a model formula of the in-plane distribution from measurement data obtained by measurement; comparing the measurement data with the model formula to calculate a set of parameters of the model formula; storing the parameters as data of the in-plane distribution over the substrate; and setting a set of reference parameters such that a distribution of the thickness of a film over the substrate exhibits high uniformity; and controlling the apparatus such that the parameters change closer to the reference parameters, wherein the measurement data includes measurement coordinates over the substrate, and the model formula is obtained by modeling the tendency that the in-plane distribution concentrically varies and the tendency that the in-plane distribution varies along a diameter direction.

In the above structure of the present invention, the in-plane distribution over a semiconductor substrate is modeled in consideration of the two tendencies that the in-plane distribution concentrically varies and the in-plane distribution varies along the diameter direction. Specifically, the in-plane distribution is modeled in consideration of the following circumstances. The in-plane distribution over the substrate has a tendency to be "concentric" due to the shape of a chamber of a semiconductor substrate process apparatus. A process apparatus which is relatively provided with respect to a wafer to be processed has an avoidable small "tilt" (for example, in the parallelism of a source gas supply shower head facing to a wafer holder of the apparatus, the parallelism between a sputter target and a wafer in a PVD process, or the like), which is a defect ascribed to the apparatus itself. The concentric distribution is deformed to an elliptic shape due to an influence of an exhaustion port and/or other unperfect radially-symmetrical shape of a process chamber. The centers of concentric circles are offset due to the position accuracy of the wafer on the wafer holder. Then, measured values at a plurality of predetermined measurement points over the substrate surface are applied to the model formula to obtain coefficients (parameters) of the model formula which are necessary for reproducing the in-plane distribution, and only the model formula and the parameters are stored. The in-plane distribution is reproduced with the stored model formula and parameters. Then, parameters which need to be adjusted are calculated based on the reproduced in-plane distribution. With such parameters, maintenance of the apparatus can be performed without exposing a vacuum chamber to atmosphere. As a result, the in-plane distribution can be improved without making a large change in the apparatus conditions between a pre-maintenance state and a post-maintenance state.

BRIEF DESCRIPTION OF THE DRAWINGS

FIG. 5 shows sheet resistance measurement positions over a wafer according to embodiment 2 of the present invention.

FIG. 6 shows the wafer in-plane distribution of measured values of the sheet resistance according to embodiment 2 of the present invention.

FIG. 7 shows measured values of the sheet resistance in a radial direction over the wafer according to embodiment 2 of the present invention.

FIG. 15 shows a cause of a fitting residual error according to embodiment 2-2 of the present invention.

DESCRIPTION OF THE PREFERRED EMBODIMENTS

Hereinafter, embodiments of the present invention are described with reference to the drawings.

Embodiment 1

Embodiment 1 of the present invention is described with reference to FIGS. 1 to 4.

Figure 1A:
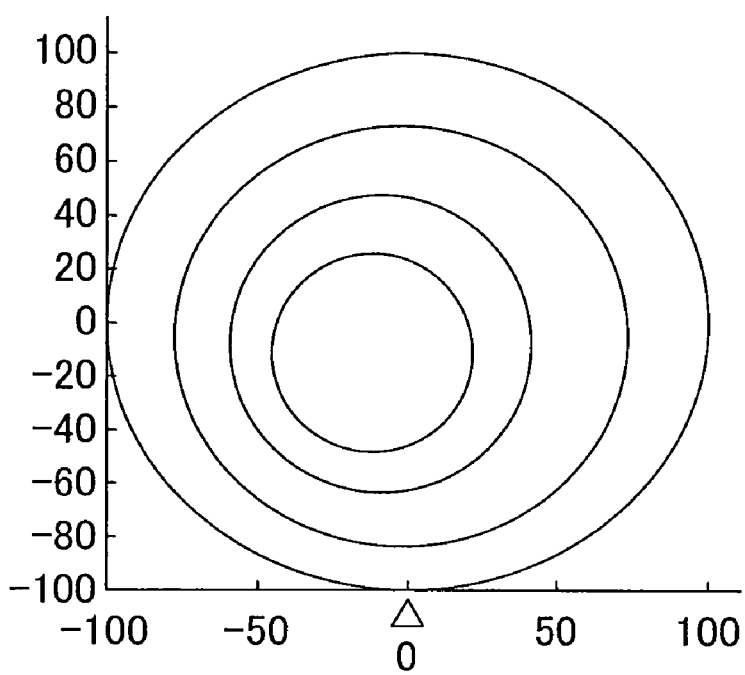
FIG. 1 shows the tendency of the in-plane distribution of data over a substrate according to embodiment 1 of the present invention.
Figure 1B:
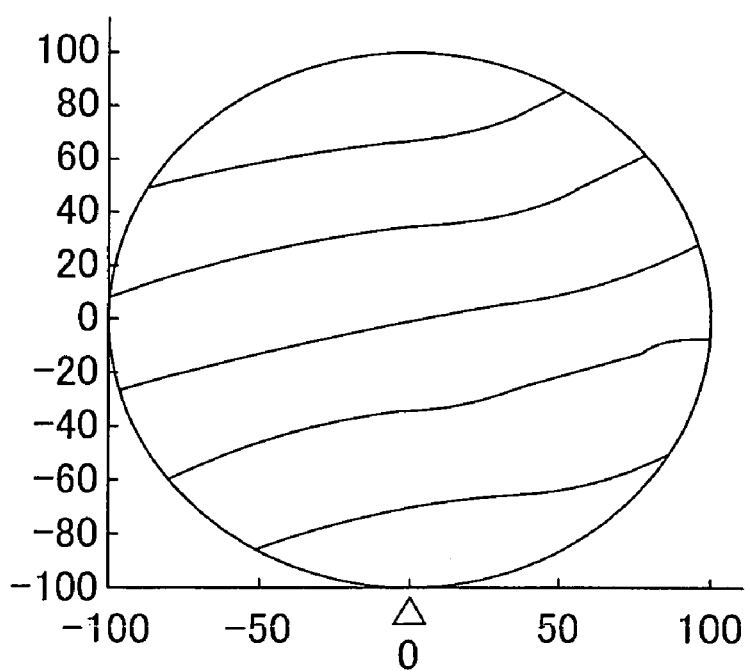
Figure 2:
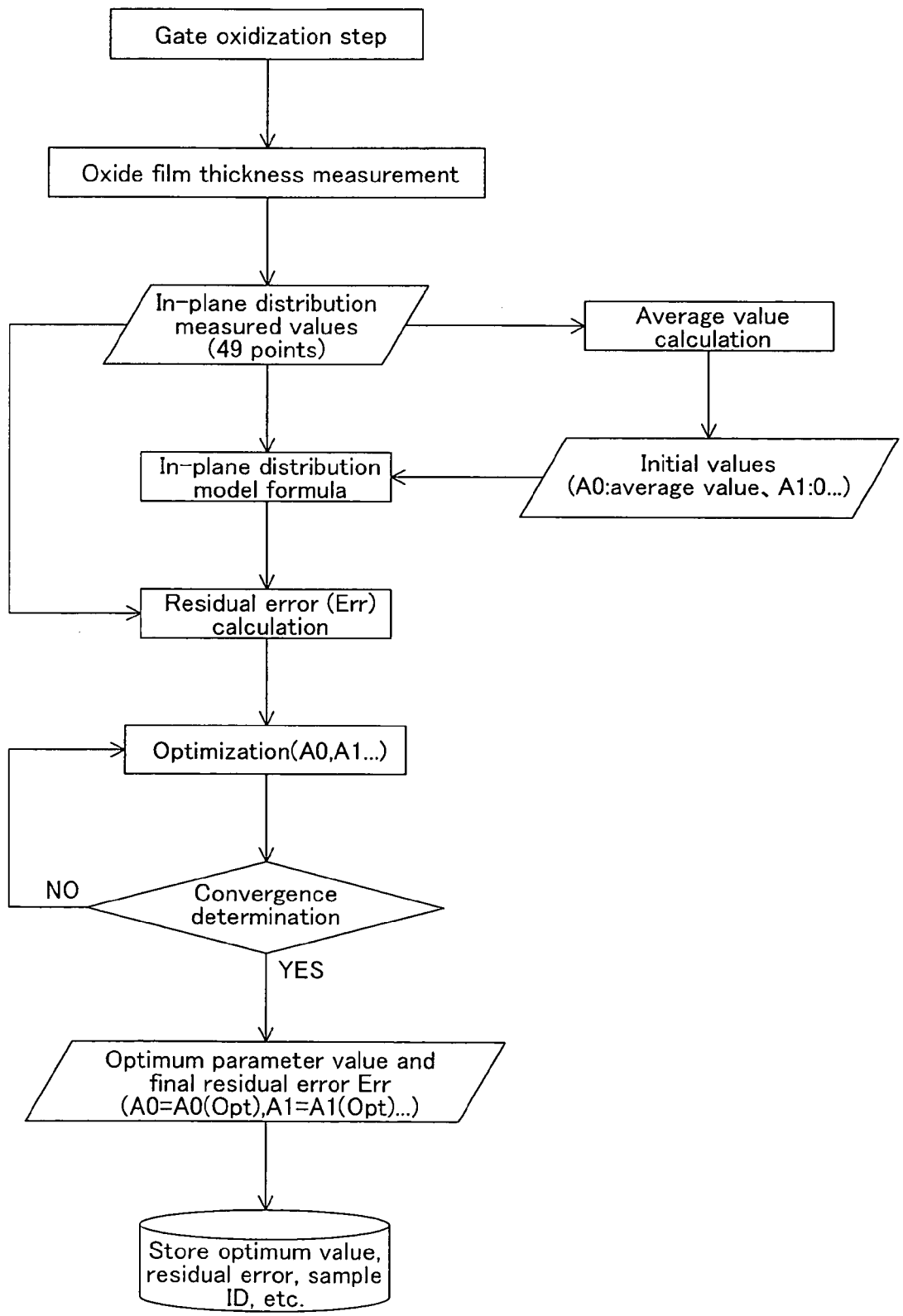
FIG. 2 is a flowchart illustrating a compression method for in-plane distribution data according to embodiment 1 of the present invention.
Figure 3:
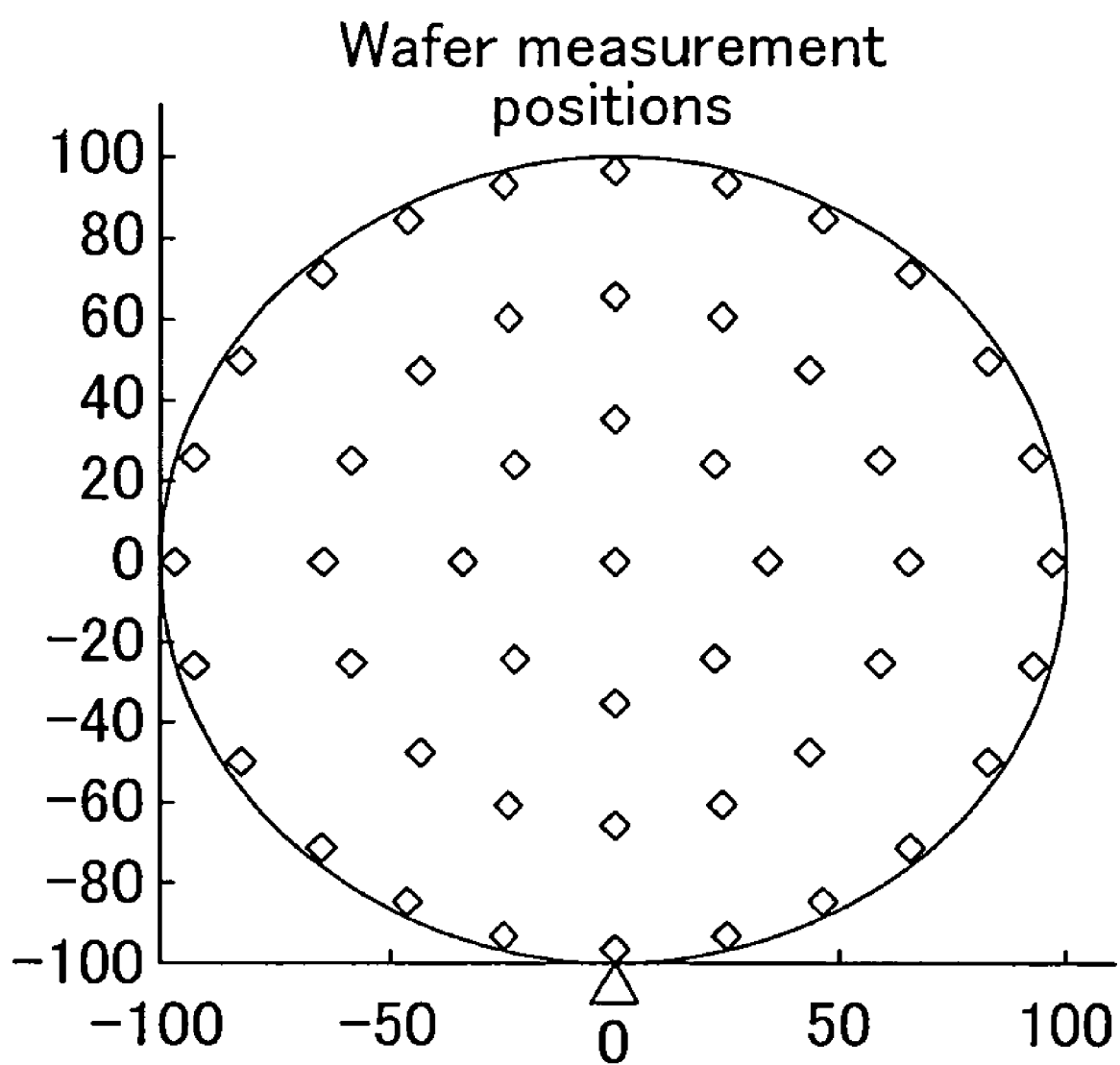
FIG. 3 shows in-plane measurement positions over a substrate according to embodiment 1 of the present invention.
Figure 4:
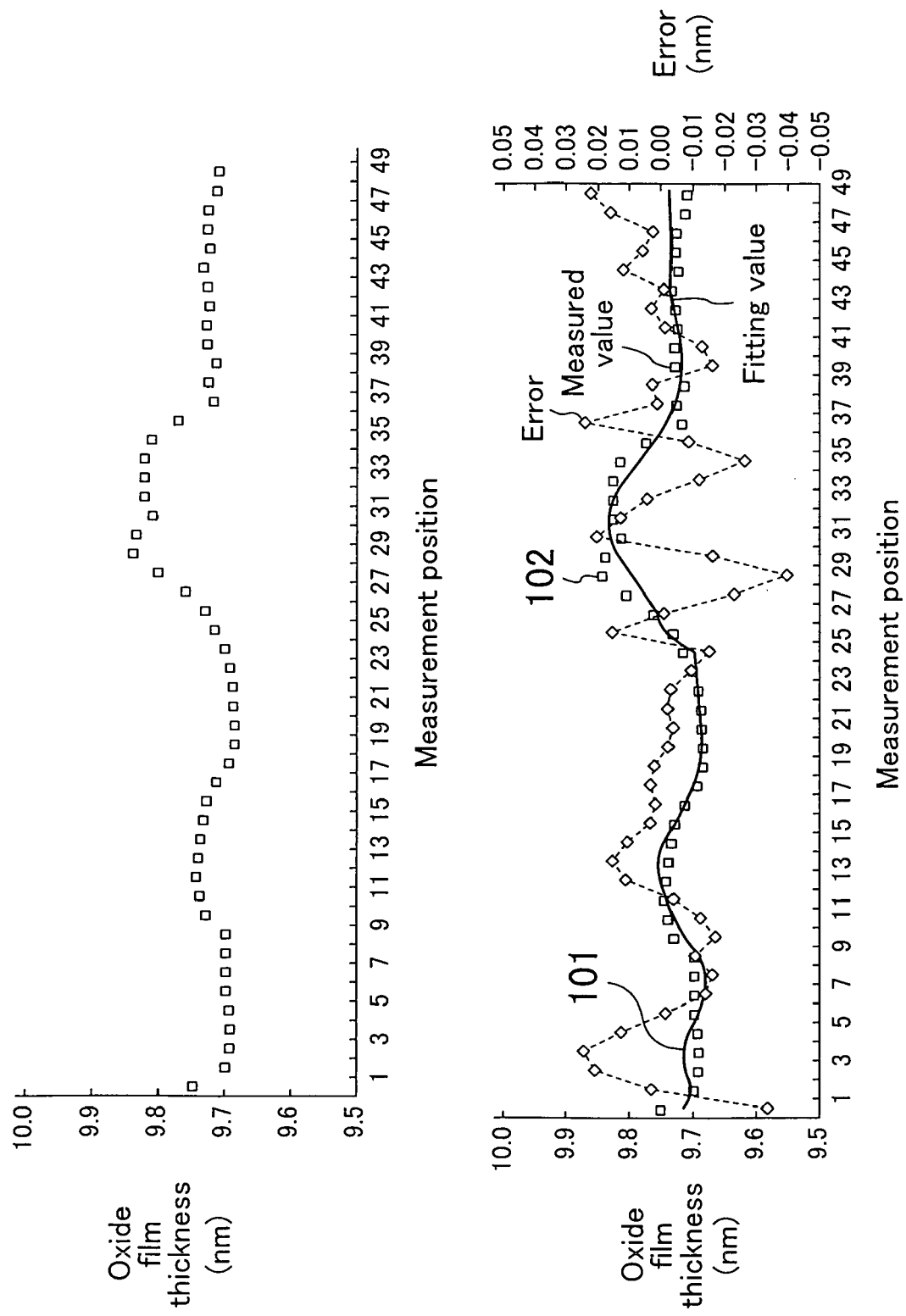
FIG. 4 shows the thickness of an oxide film according to embodiment 1 of the present invention.

FIGS. 1A and 1B show the in-plane distribution of data over a substrate according to embodiment 1 of the present invention. FIG. 2 is a flowchart illustrating a compression method for the in-plane distribution data according to embodiment 1 of the present invention. FIG. 3 shows in-plane measurement positions over a substrate according to embodiment 1 of the present invention. FIG. 4 shows the thickness of an oxide film according to embodiment 1 of the present invention.

In the first place, a method for modeling the wafer in-plane distribution of the film thickness, or the like, which constitutes the basis of the present invention, is described. In general, an existing semiconductor production apparatus has a concentric structure with respect to the center of a wafer for the purpose of improving the wafer in-plane uniformity as much as possible. As a result, the wafer in-plane distribution of the film thickness, or the like, exhibits a concentric distribution as shown in FIG. 1A. In a CVD apparatus or sputtering apparatus, a material of a film to be produced is supplied from a surface that faces a wafer. In an etching apparatus, an etching gas is supplied from a surface that faces a wafer. In a gate oxidization apparatus, heating is performed from a surface that faces a wafer. These are examples of the processes to be performed over the substrate. FIG. 1B shows the distribution obtained when the apparatus plane that faces the wafer is not in parallel to the wafer, i.e., is tilted in a certain direction.

In the present invention, the above-described circumstances are considered. The present inventor modeled the wafer in-plane uniformity using the following 9 parameters:

Coefficient of the zeroth order term: $A_0$
Coefficient of the first order term: $A_1$
Coefficient of the second order term: $A_2$
Shift amount in X direction (mm): $X_0$
Shift amount in Y direction (mm): $Y_0$
Roundness factor: B (perfect circle at 0.5)
Rotation factor: $\theta$
X-direction tilt coefficient: $A_x$
Y-direction tilt coefficient: $A_y$ $$F(x, y) = A_0 + A_1 R + A_2 R^2 + A_x \cdot x + A_y \cdot y \quad (1)$$

where $F(x, y)$ is a measured value at point $(x, y)$ over the wafer.

Herein, R is expressed by formulas (2) and (3):

$$R^2 = (X-X_0)^2/B + (Y-Y_0)^2/(1-B) \quad (2)$$

$$X = x \cos\theta - y \sin\theta, \; Y = x \sin\theta + y \cos\theta \quad (3)$$

The former three terms of formula (1) depend on the radial direction with respect to the distribution center $(X_0, Y_0)$ over a plane of a wafer. The latter two terms correspond to the tilt of the wafer.

In order to obtain the above 9 parameters with high reproducibility, the initial values of the parameters were set as shown below. An optimum value which minimizes the sum of squares of the differences between a model value and a measured value at each measurement point was obtained by the least-squares method.

Setting of the initial values, which are important to achieve stable convergence in the optimization of the parameters, are as follows:

<<Setting of Initial Values>>
Coefficient of the zeroth order term: $A_0$=average value, mode, or median value
Coefficient of the first order term: $A_1$=0
Coefficient of the second order term: $A_2$=0
Shift amount in X direction (mm): $X_0$=0
Shift amount in Y direction (mm): $Y_0$=0
Roundness factor: B (perfect circle at 0.5)=0.5
Rotation factor: $\theta$=0
X-direction tilt coefficient: $A_x$=0
Y-direction tilt coefficient: $A_y$=0

Herein, the least-squares method was used for the optimization of the parameters. However, the minimum entropy method, or the like, may be used instead. Furthermore, detailed data can be obtained from any area by, for example, assigning weights to an outer perimeter region or inner perimeter region for F(x, y) of formula (1).

The sum of squares of the differences between a model value and a measured value obtained after parameter fitting can be normalized as the average value of the squared residual error rates ([(model value-measured value)/measured value]$^2$) at measurement points as shown in formula (4):

$$Err=[\Sigma\{F(x, y)-M(x, y)/M(x, y)\}^2]/N \qquad (4)$$

where M(x, y) is the measured value at position (x, y), and N is the number of measurement points.

By using this Err, the accuracy of the model can be compared under different conditions.

Next, a data storage method of the present invention is described. Herein, the data storage method is described with reference to the flowchart of FIG. 2 with an example of the step of measuring the thickness of a gate oxide film in the gate oxidization process.

In the first place, a silicon substrate was oxidized to about 10 nm depth under standard control conditions. The thickness of a resultant oxide film was measured with an ellipsometer to measure the in-plane distribution of the thickness. The measurement was performed at 49 points around the origin (0, 0) at the center of the wafer as shown in FIG. 3.

FIG. 4A shows measured values at the measurement positions. The horizontal axis represents the measurement positions (1 to 49). The vertical axis represents the thickness of the oxide film.

Then, the initial values of the coefficients of formulas (1), (2) and (3) were determined based on the measured values as shown below:

Coefficient of the zeroth order term: $A_0$=Average of the measured values=9.7355
Coefficient of the first order term: $A_1$=0
Coefficient of the second order term: $A_2$=0
Shift amount in X direction (mm): $X_0$=0
Shift amount in Y direction (mm): $Y_0$=0
Roundness factor: B (perfect circle at 0.5)=0.5
Rotation factor: θ=0
X-direction tilt coefficient: $A_x$=0
Y-direction tilt coefficient: $A_y$=0

The measured value of each measurement point was applied to formula (1) using the above initial values to calculate fitting residual error ERR shown by formula (4).

Further, the above 9 parameters were optimized using the least-squares method such that Err was minimized.

The results of the optimization are shown below:

Coefficient of the zeroth order term: $A_0$=9.716377128 (nm)
Coefficient of the first order term: $A_1$=−0.000732175
Coefficient of the second order term: $A_2$=7.42202E-06
Shift amount in X direction (mm): $X_0$=−0.000813515 (mm)
Shift amount in Y direction (mm): $Y_0$=−0.000738381 (mm)
Roundness factor: B (perfect circle at 0.5)=0.374560217
Rotation factor: θ=4.05928E-05 (radian)
X-direction tilt coefficient: $A_x$=−0.000514376
Y-direction tilt coefficient: $A_y$=9.74377E-05

These fitting results are used to show the comparison between the values calculated from the model formula (1) at the measurement points over the wafer (fitting values) and the measured values in FIG. 4B. Further, the differences (errors) between the fitting values and the measured values at the measurement points are shown with the right vertical axis.

As seen from FIG. 4B, the difference between graph 101 which represents the fitting results and the measured values 102 is within the range of ±0.04 (nm). That is, it is seen that the results at the measurement points over the wafer are satisfactorily reproduced.

That is, the wafer in-plane distribution of the oxide film thickness in the 49-point measurement is accurately reproduced with the above-described 9 stored parameters.

Embodiment 2

Embodiment 2 of the present invention is described with reference to FIGS. 5 to 9.

Figure 8:
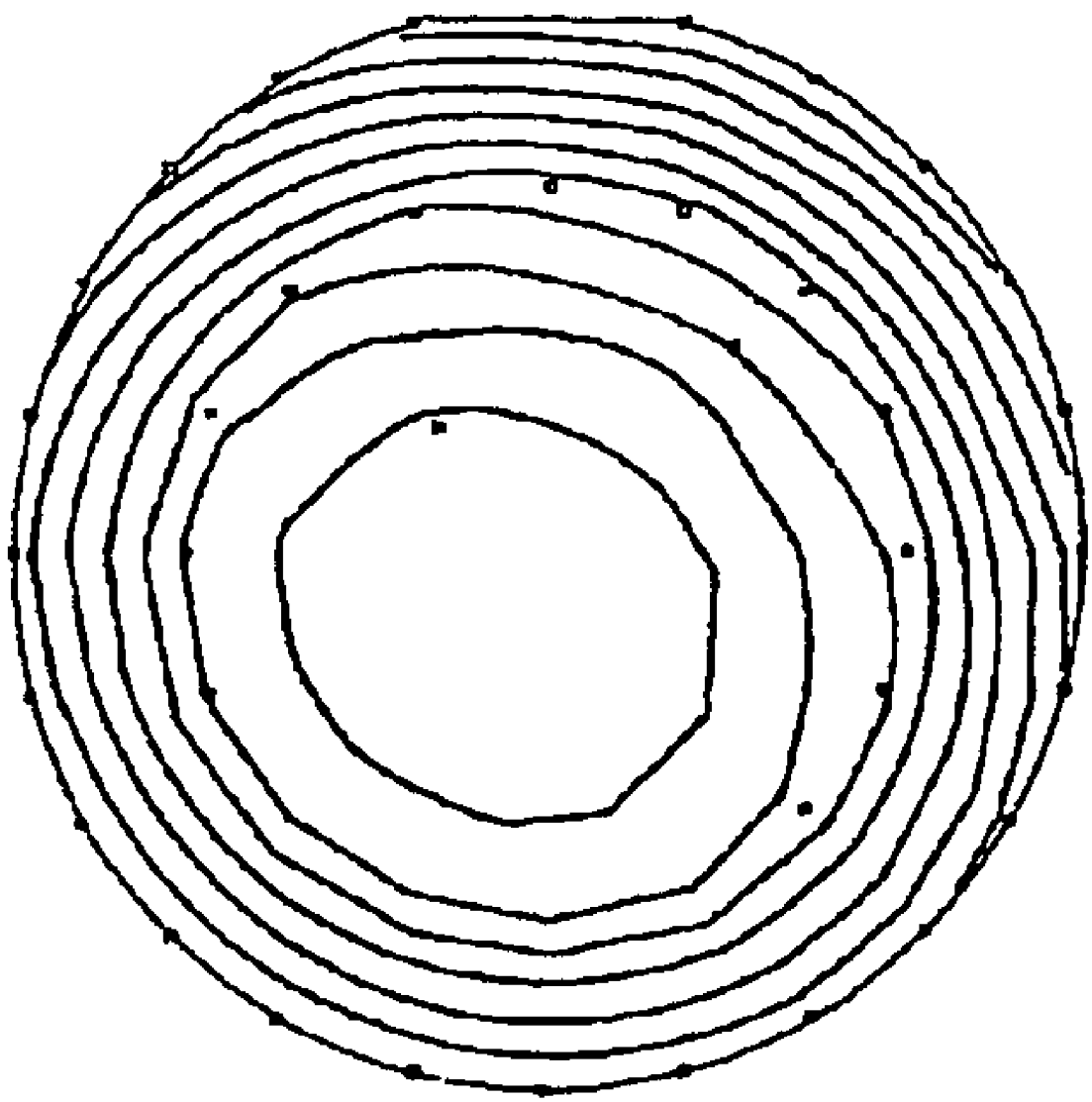
FIG. 8 shows the in-plane distribution of the sheet resistance which is obtained from a model formula according to embodiment 2 of the present invention.
Figure 9:
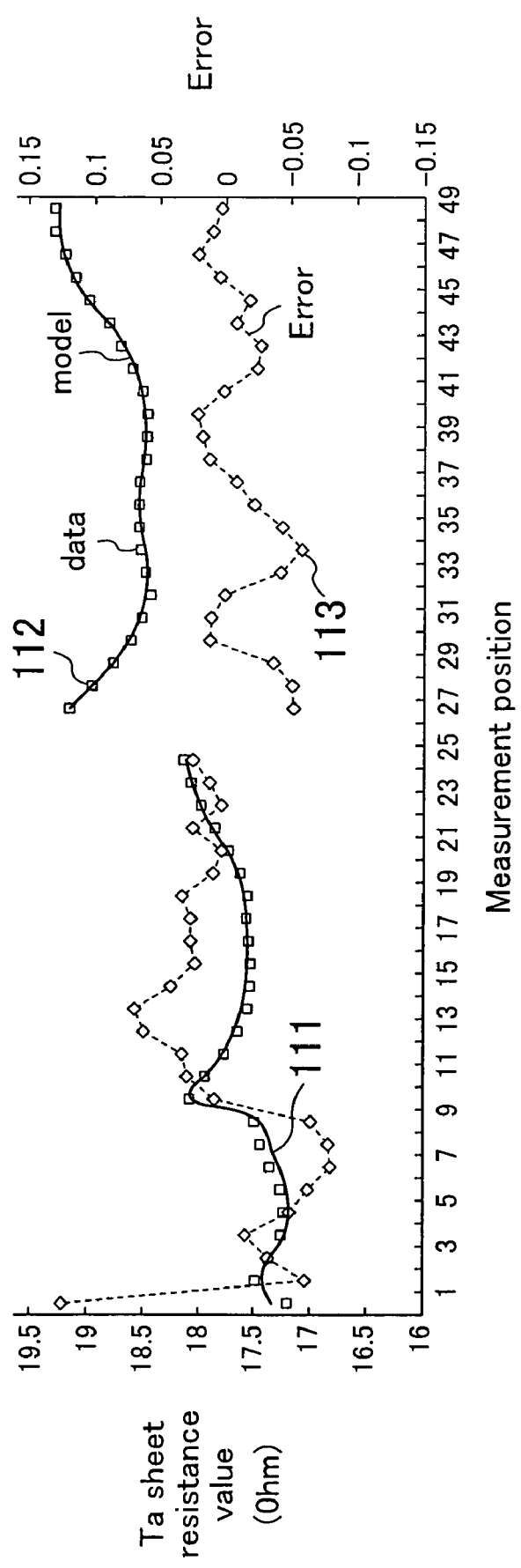
FIG. 9 shows a fitting result of the sheet resistance according to embodiment 2 of the present invention.

FIG. 5 shows the sheet resistance measurement positions over the wafer according to embodiment 2. FIG. 6 shows the wafer in-plane distribution of measured values of the sheet resistance according to embodiment 2. FIG. 7 shows measured values of the sheet resistance in a radial direction over the wafer according to embodiment 2. FIG. 8 shows the in-plane distribution of the sheet resistance which is obtained from a model formula according to embodiment 2. FIG. 9 shows a fitting result of the sheet resistance according to embodiment 2.

Embodiment 2 is described with an example of a result obtained by evaluating the in-plane distribution of the thickness of a Ta film formed by sputtering over a wafer (substrate) by the sheet resistance value. Since the sheet resistance value of the Ta film is inversely proportional to the film thickness, the film is thin at a position of a high sheet resistance, whereas the film is thick at a position of a low sheet resistance.

FIG. 5 shows sheet resistance measurement positions over the wafer. The measurement positions are on three circles of different radii, the centers of the circles being on the wafer center. Herein, the in-plane distribution is evaluated using a statistical value of measured values.

FIG. 6 shows the wafer in-plane distribution of measured values of the sheet resistance. In FIG. 6, it is seen that the sheet resistance exhibits a substantially concentric distribution, and the resistance is higher in the wafer perimeter area. It is also seen that the resistance is higher in the upper right part of the wafer shown in FIG. 6. FIG. 7 shows the average value, maximum value and minimum value of the measured value for each of the radii.

The present inventor evaluated the in-plane distribution of the sheet resistance using model formula (1). The process of the flowchart shown in FIG. 2 of embodiment 1 was performed, whereby the in-plane distribution of the Ta sheet resistance was modeled based on the measured values at the 49 points over the wafer shown in FIG. 6, and the following parameters were optimized by the least-squares method.

Coefficient of the zeroth order term: $A_0$=17.33369787
Coefficient of the first order term: $A_1$=−0.006726995
Coefficient of the second order term: $A_2$=0.0001272
Shift amount in X direction (mm): $X_0$=0.001736865 (mm)
Shift amount in Y direction (mm): $Y_0$=−0.001419326 (mm)
Roundness factor: B (perfect circle at 0.5)=0.543039488
Rotation factor: θ=0.400701736 (radian)

X-direction tilt coefficient: $A_x$=0.001837942

Y-direction tilt coefficient: $A_y$=0.001837942

FIG. 8 shows the in-plane distribution of the sheet resistance value calculated from the model formula using the above parameters. Comparing this in-plane distribution with the measured values of FIG. 6, the modeled in-plane distribution shown in FIG. 8 is very similar to the in-plane distribution of the measured values.

FIG. 9 shows a fitting result of the sheet resistance. FIG. 9 shows the measured values 112 at the measurement positions, the graph 111 which represents the values obtained after the fitting, and the error (graph 113) which is the difference between the measured values 112 and the graph 111 (vertical axis). As seen from FIG. 9, the error is within the range of ±0.15 Ohm. It is seen that highly-accurate modeling is achieved with the model formula of embodiment 2.

In a conventional method wherein a technician checks the wafer in-plane distribution of the measured values of the sheet resistance, the technician determines that it is a concentric distribution whose center is far off from the center of the wafer. However, it can be seen from the above parameters representing the above in-plane distribution, which are obtained according to the present invention, that the center of the distribution is off from the wafer center by only about 0.002 mm or smaller, and the real reason of the high resistance portion at the upper right area over the wafer is that the concentric distribution is deformed into an elliptic shape.

Embodiment 2-2

Figure 11:
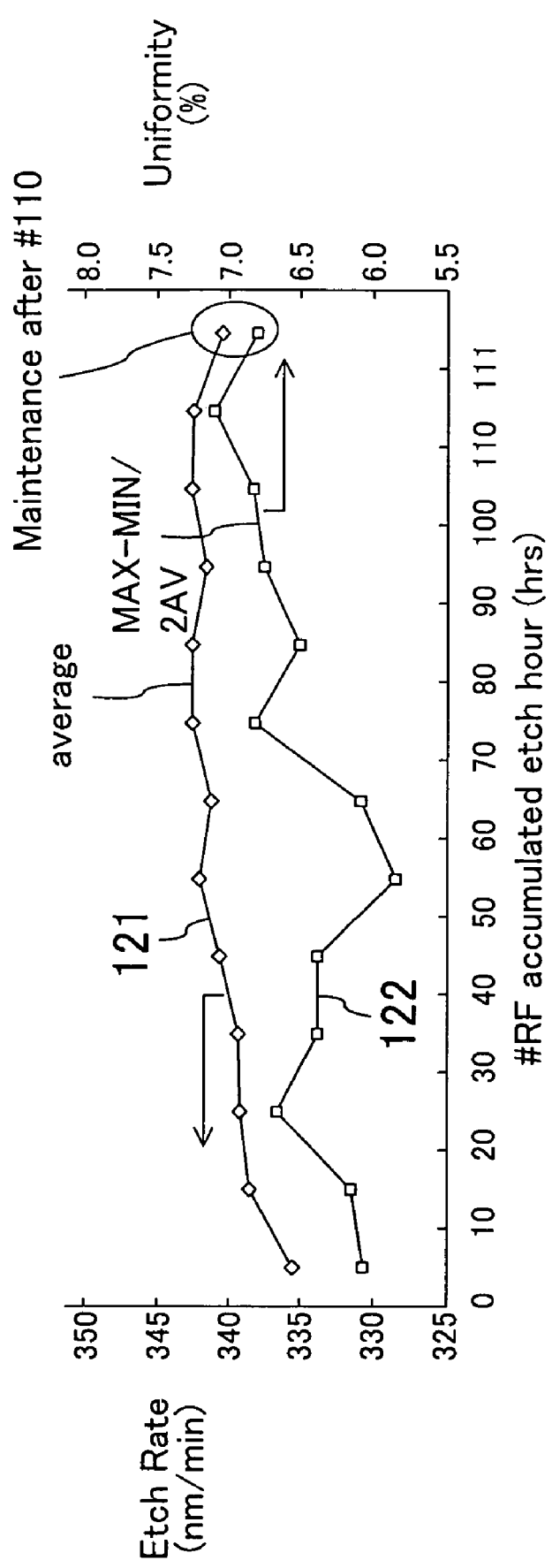
FIG. 11 shows the time variation of the etching rate according to embodiment 2-2 of the present invention.
Figure 12:
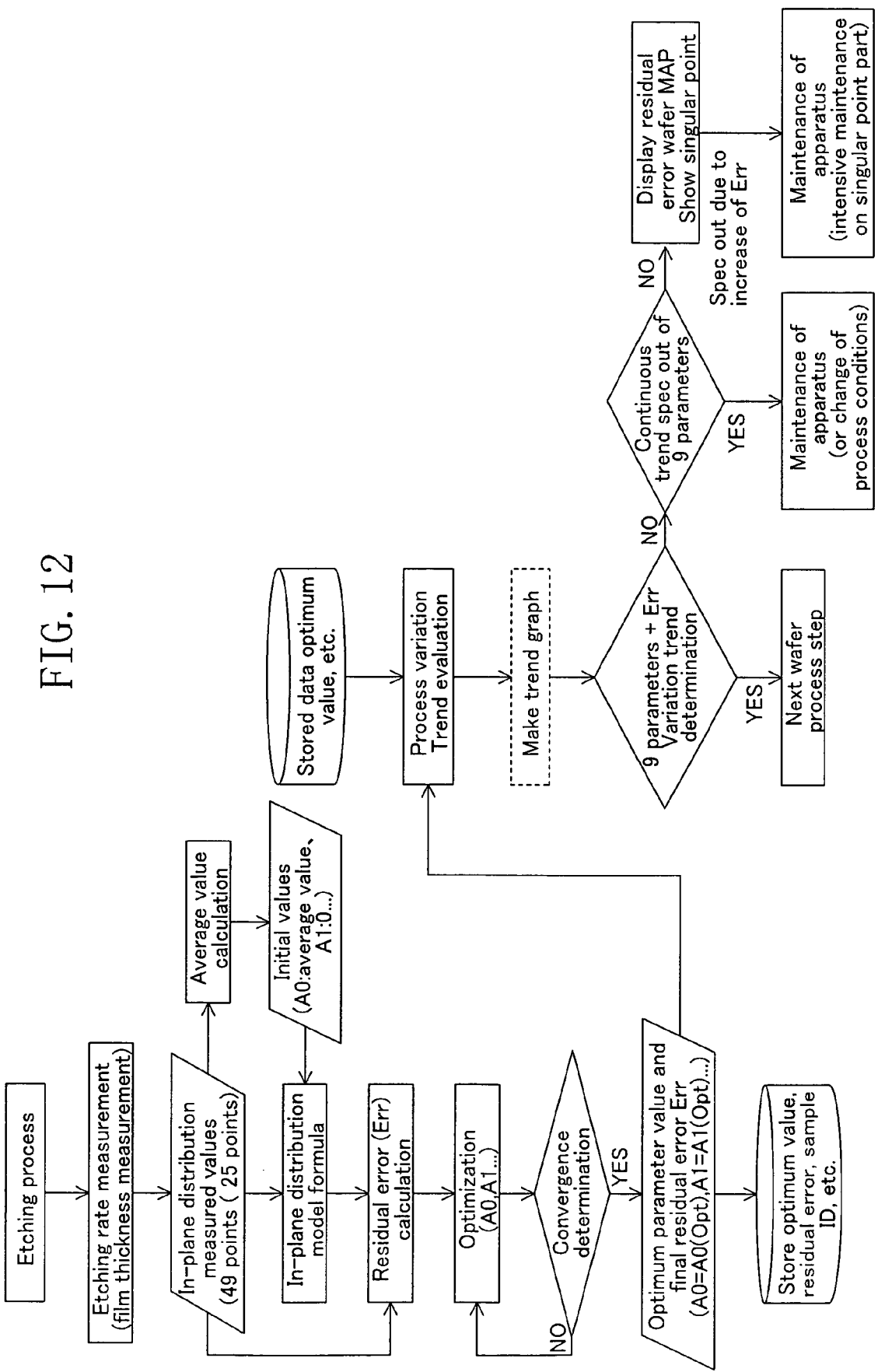
FIG. 12 is a flowchart illustrating the modeling and evaluation according to embodiment 2-2 of the present invention.
Figure 16:
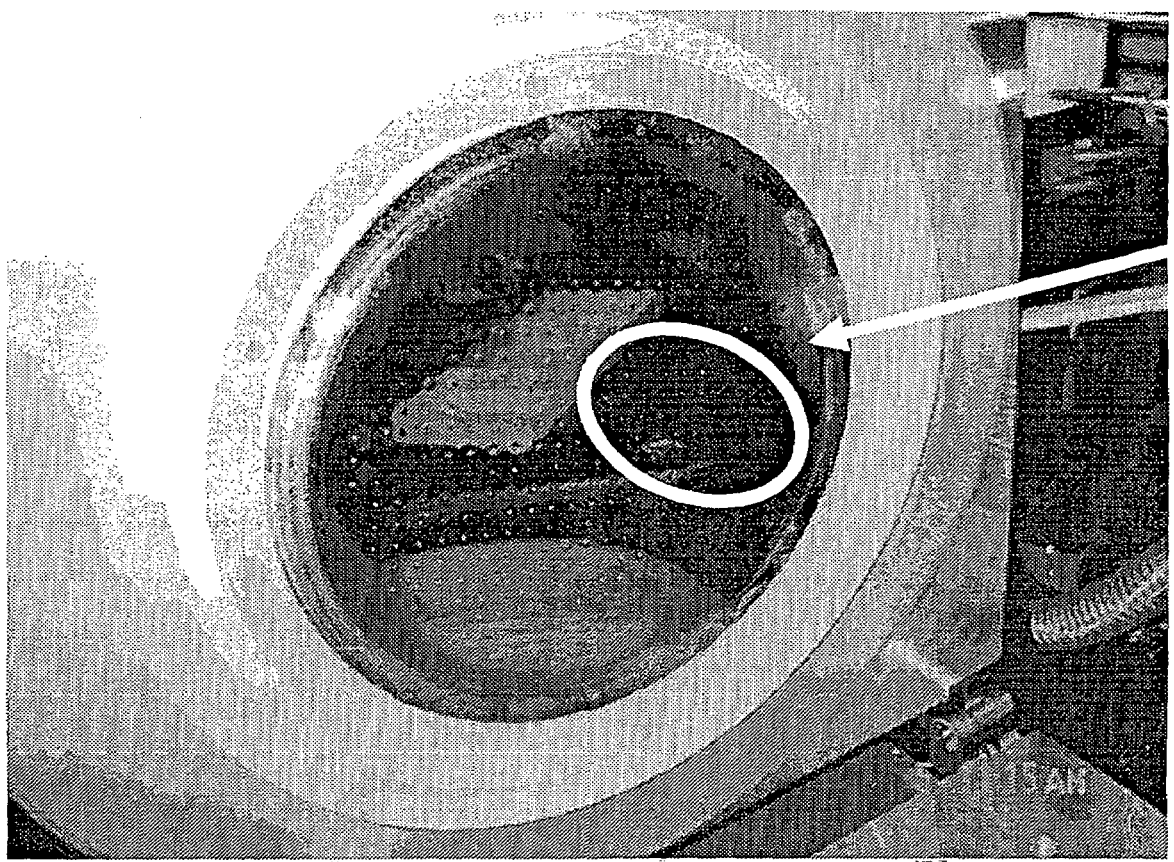
FIG. 16 shows an etching chamber according to embodiment 2-2 of the present invention.

Embodiment 2-2 of the present invention is described with reference to FIGS. 10 to 16. FIG. 10 shows measurement positions for the etching rate according to embodiment 2-2. FIG. 11 shows a time variation in the etching rate according to embodiment 2-2. FIG. 12 is a flowchart illustrating the modeling and evaluation according to embodiment 2-2. FIG. 13 shows the in-plane distribution of the etching rate according to embodiment 2-2. FIG. 14 shows a time variation in the parameters according to embodiment 2-2. FIG. 15 shows a cause of the fitting residual error according to embodiment 2-2. FIG. 16 is a photograph of an etching chamber according to embodiment 2-2.

Embodiment 2-2 is described with an example wherein an oxide film dry etching process is employed.

Figures 10A, 10B:
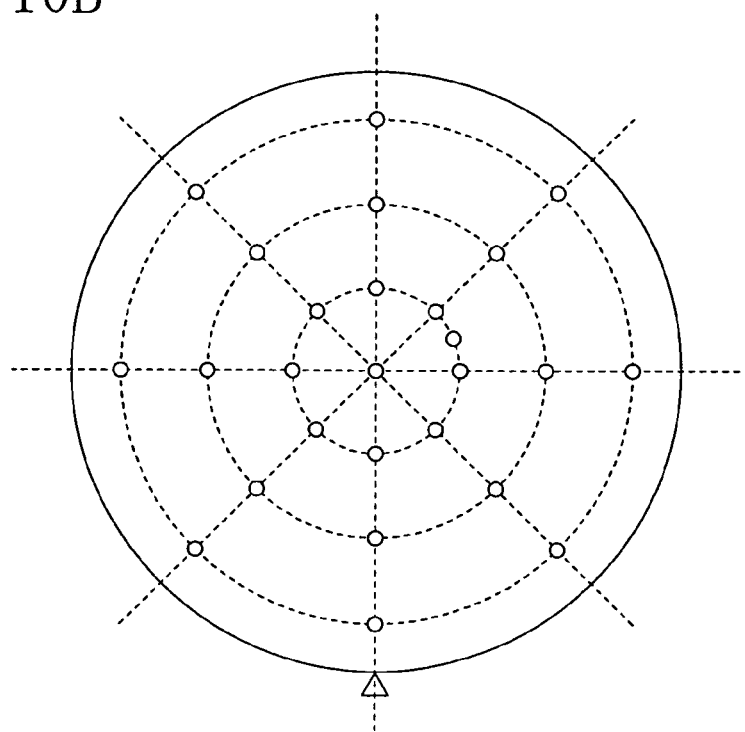
FIG. 10 shows measurement positions for the etching rate according to embodiment 2-2 of the present invention.

In the case of an oxide film dry etching process, an oxide film formed over a wafer is dry-etched, and thereafter, the film thickness is measured at predetermined 25 points in the perimeter region and the central region as shown in FIG. 10A. The etching rate is then measured at each measurement point based on the difference from the initial value of the film thickness at the same point over the oxide film before the etching, whereby the uniformity of the oxide film is evaluated. FIG. 10B shows the coordinates of the measurement points over the substrate. In order to evaluate the stability of the etching process, two wafers A1 and A2 were used to measure the etching rate. After the film thickness measurement of the wafer A1, at the time when the accumulated etching time was 10 hours, etching and thickness measurement were also performed on the wafer A2 in the same manner, and the etching rate was measured. It should be noted that the oxide films of the wafers A1 and A2 were both etched under the same conditions. FIG. 11 shows the time variation in the etching rate. Graph 121 shows the wafer in-plane average value of the etching rate up to the accumulated etching time of 100 hours. Graph 122 shows the variation [(MAX−MIN)/2×average value].

Conventionally, there has been no method for objectively evaluating a change in the wafer in-plane distribution. Thus, in a conventional method, a change in the average value and a change in the variation over the wafer are observed, and when the change exceeds a predetermined value, maintenance of a production apparatus is carried out. However, there is a variable factor which cannot be detected in the above conventional method. Now, consider a case where a change occurs in the in-plane uniformity so that, for example, an observed distribution is deviant from a concentric distribution. If the index which represents the in-plane uniformity is identical and a change in the average value is small, the resultant distribution is determined to be acceptable even in the presence of the deviance. Although it is actually unacceptable because the tendency of the in-plane distribution largely changes, the above process control cannot determine that such distribution is unacceptable.

A method for modeling the wafer in-plane uniformity, which constitutes a basis of the present invention, is now described. In general, existing semiconductor production apparatuses have a concentric structure with respect to the wafer center for the purpose of improving the wafer in-plane uniformity as much as possible and have extremely high structural symmetricalness.

In the present invention, the wafer in-plane uniformity was modeled using the above-described 9 parameters in consideration of the above conditions.

FIG. 12 shows a flowchart illustrating the process of modeling and evaluation.

In the first place, film thickness measurement was performed at in-plane measurement points (25 points in a plane) shown in FIG. 10, and the etching rate at each measurement point was calculated. Then, the average value of the measured values was calculated, and the 9 parameters of the above-mentioned model formula (1) were set as follows:

Coefficient of the zeroth order term: $A_0$=Average value of in-plane 25 points

Coefficient of the first order term: A1=0

Coefficient of the second order term: $A_2$=0

Shift amount in X direction (mm): $X_0$=0

Shift amount in Y direction (mm): $Y_0$=0

Roundness factor: B (perfect circle at 0.5)=0.5

Rotation factor: θ=0

X-direction tilt coefficient: $A_x$=0

Y-direction tilt coefficient: $A_y$=0

Then, the in-plane coordinates at each of the measurement points shown in FIG. 10 were applied to formula (1) and formula (3) illustrated in embodiment 1, and the 9 parameters were optimized using the least-squares method such that squared residual error rates ERR represented by formula (4) was minimized.

Figure 13A:
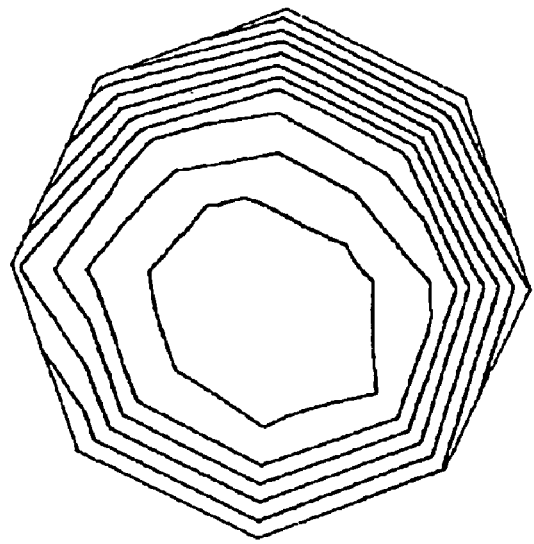
FIG. 13 shows the in-plane distribution of the etching rate according to embodiment 2-2 of the present invention.
Figure 13B:
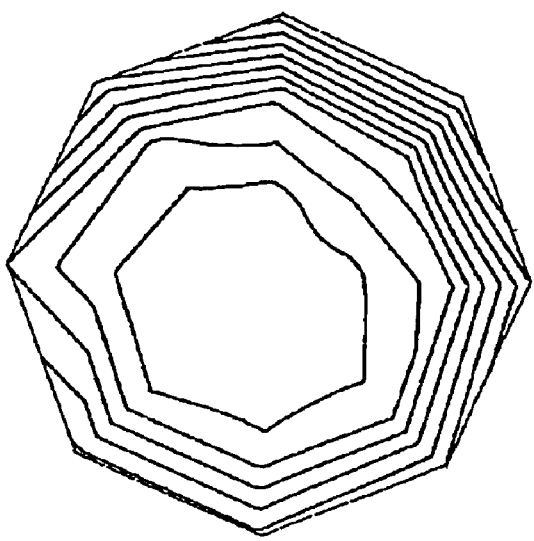

FIG. 13A shows the in-plane distribution of the etching rate obtained based on the measured values. FIG. 13B shows the in-plane distribution of the etching rate obtained after the fitting process with the 9 parameters. Comparing these two in-plane distributions, it is seen that the reproducibility is very much improved by the fitting.

In order to evaluate process variations and trend changes, some parameters are plotted with respect to the accumulated etching time as shown in FIGS. 14A to 14D.

Figure 14B:
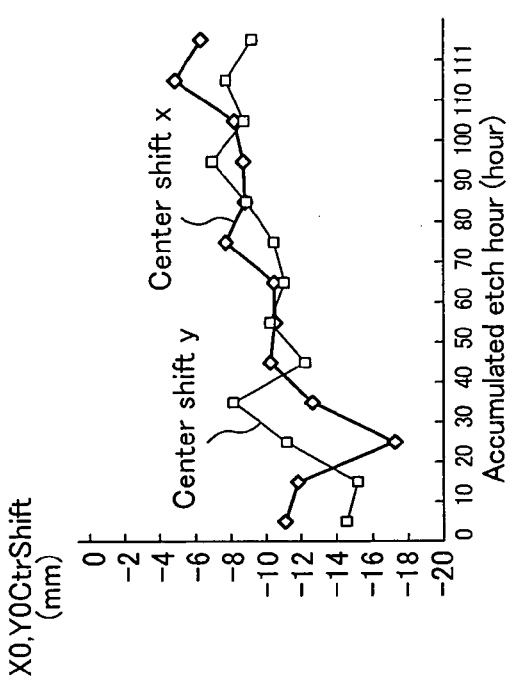
FIG. 14 shows the time variation of the parameters according to embodiment 2-2 of the present invention.
Figure 14D:
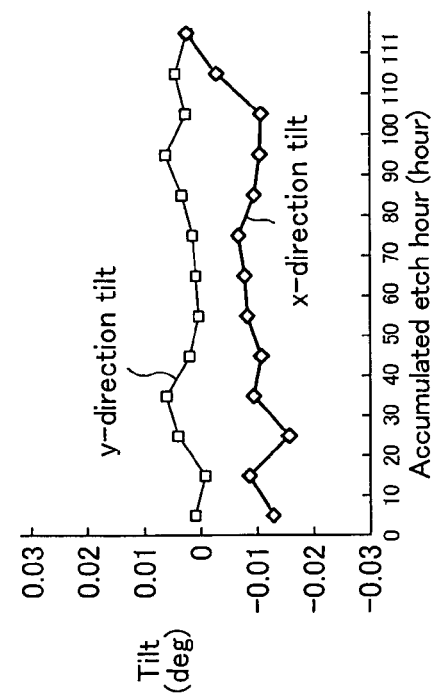
Figure 14A:
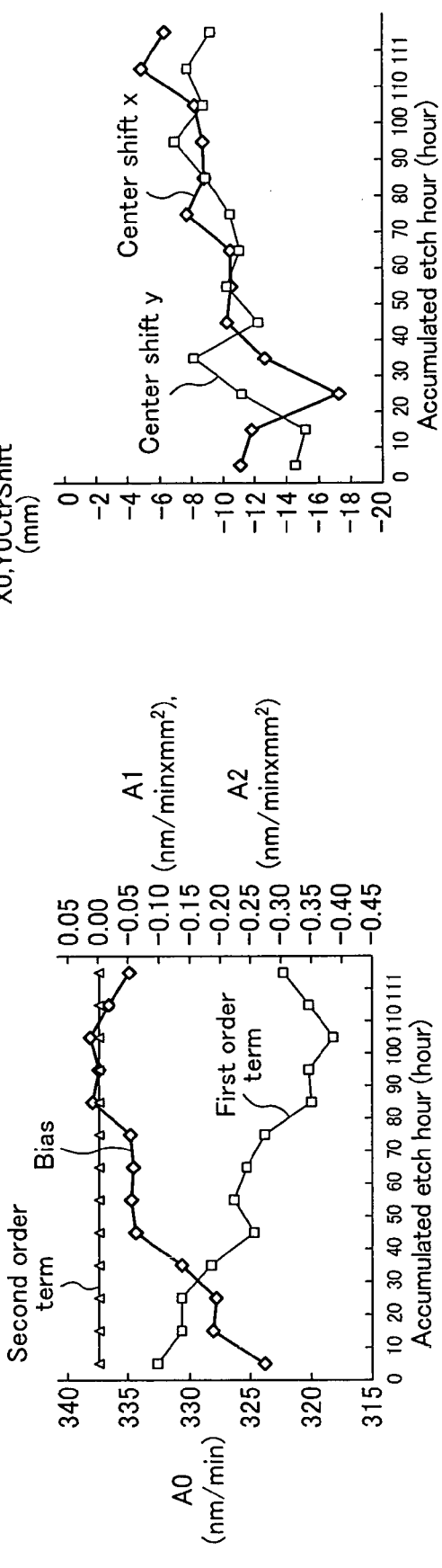

FIG. 14A is a trend graph for the bias. FIG. 14B is a trend graph for the center shift.

Figure 14C:
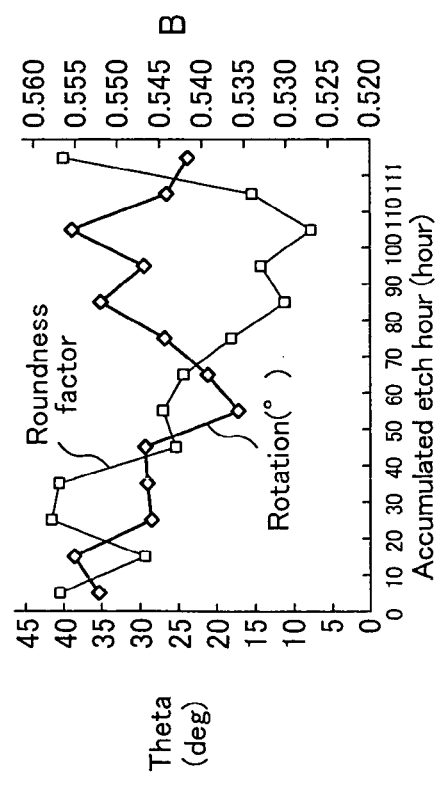

FIG. 14C is a trend graph for the rotation. FIG. 14D is a trend graph for the X and Y directions. The tilt coefficients shown in FIG. 14D are such that $A_x$ and $A_y$ are normalized with $A_0$ to obtain $\tan^{-1}(A_x/A_0)$ and $\tan^{-1}(A_y/A_0)$ as tilts.

The specifications are respectively set for these values, whereby objective evaluation can be made not only to the etching rate but also to a variation in the wafer in-plane distribution.

In the conventional method, referring to FIG. 11, the in-plane uniformity was out of the specification (±3.5% (range: 7%)) at a point where the accumulated etching time was 110 hours, and therefore, chamber maintenance was carried out. Closely evaluating the changes in the in-plane distribution according to the trend graphs of FIGS. 14A to 14D based on the present invention, a large change is found in the factor which represents the roundness (right axis of FIG. 14C) between point 110 and point 111 of the accumulated time which respectively occur before and after the maintenance. This indicates that the in-plane distribution was restored by the maintenance. Thus, it is recognized that, in the process of controlling the in-plane distribution, the maintenance should have been carried out at 80-hour point of the accumulated time at which the roundness factor is substantially equal to that obtained at 110-hour point. That is, an abnormality in the production apparatus can be determined from a variation in the value of "B" (roundness factor) which is one of the parameters.

Graph (a) of FIG. 15 shows a variation in the value obtained by multiplying ERR of formula (4) at each measurement point by the number of measurement points (25 points). This value indicates the degree of resemblance of the model and has a tendency to increase when any of the 25 measurement points exhibits a singular change. Patterns (b) to (e) show the wafer in-plane distribution of a value obtained by subtracting a measured value from a fitting value (fitting error) at typical points of the accumulated etching time shown in the graph (a) of FIG. 15. This corresponds to the "residual error wafer MAP representation" in the flowchart of FIG. 12 which has been illustrated in embodiment 2.

Evaluating the wafer in-plane distribution of this fitting value, it is seen that a large change is found in the difference between the fitting value and the measured value singularly in an area encircled by a double-line circle in pattern (e) of FIG. 15. FIG. 16 shows a photograph of an etching chamber. This photograph shows that a surface area of a shower head which faces the area encircled by the double-line circle in pattern (e) of FIG. 15 (a surface area encircled by a white circle in FIG. 16) is roughened. That is, a cause of the singular point over the wafer is readily estimated. In this way, according to the present invention, the degree of resemblance of the fitting value which is represented by the model formula is quantitatively evaluated. Thus, the maintenance frequency and the condition of a semiconductor production apparatus can be estimated with high accuracy as compared with the conventional methods, and accordingly, highly accurate process control can be achieved.

Embodiment 3

Embodiment 3 is described with reference to FIGS. 17 to 23.

Figure 17:
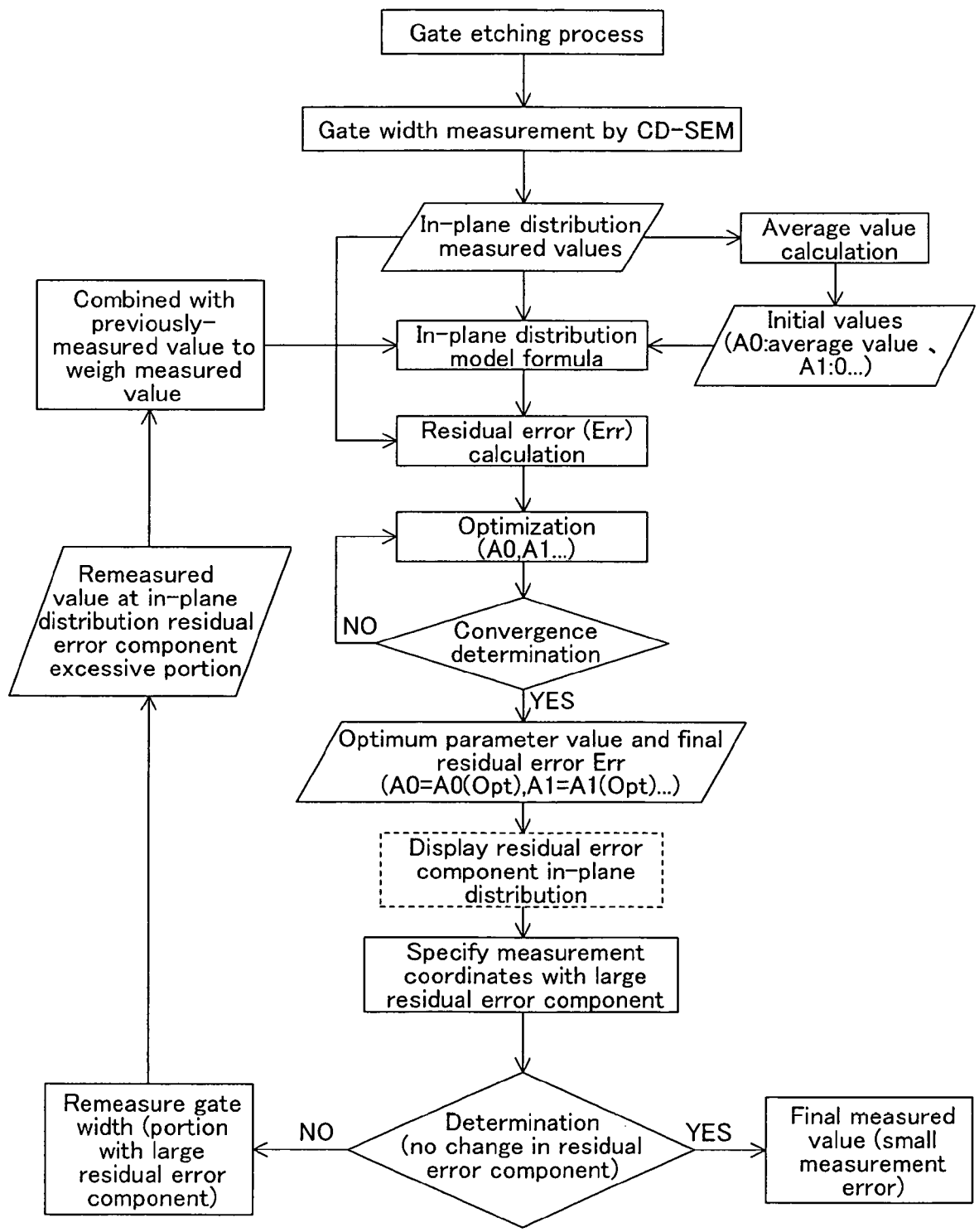
FIG. 17 is a flowchart illustrating the improvements in measurement accuracy and measurement reliability according to embodiment 3 of the present invention.
Figure 18:
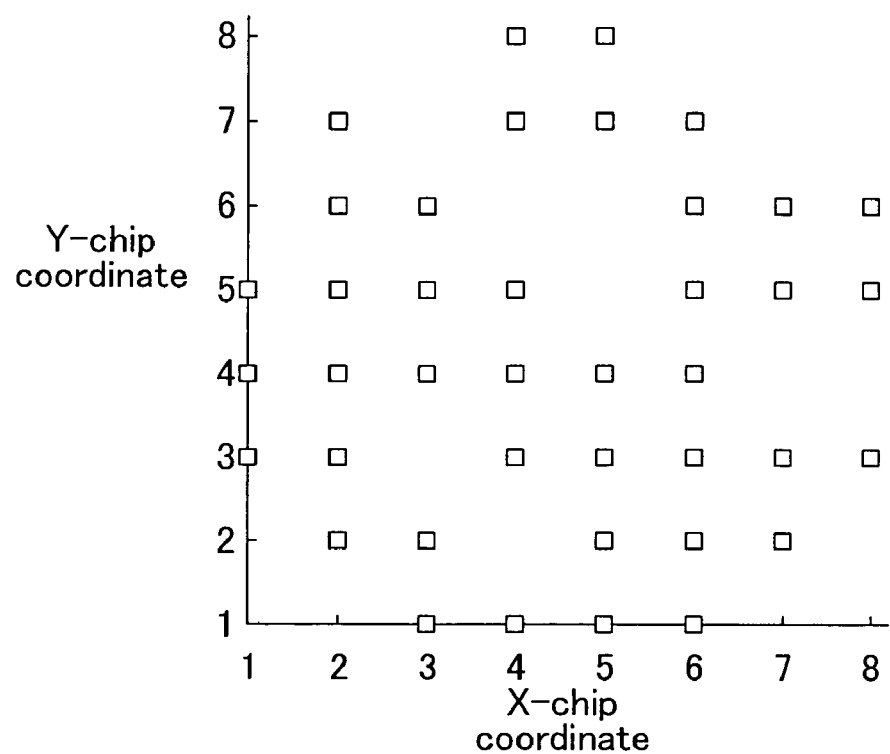
FIG. 18 shows measurement coordinates over the wafer according to embodiment 3.
Figure 19:
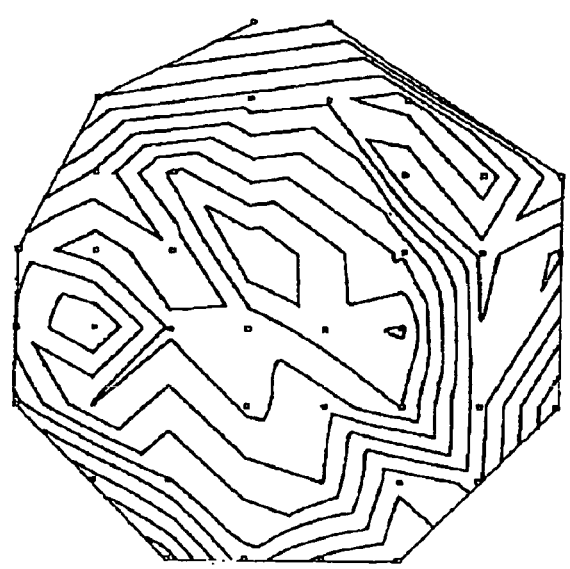
FIG. 19 shows a measurement result of the gate width according to embodiment 3 of the present invention.
Figure 20:
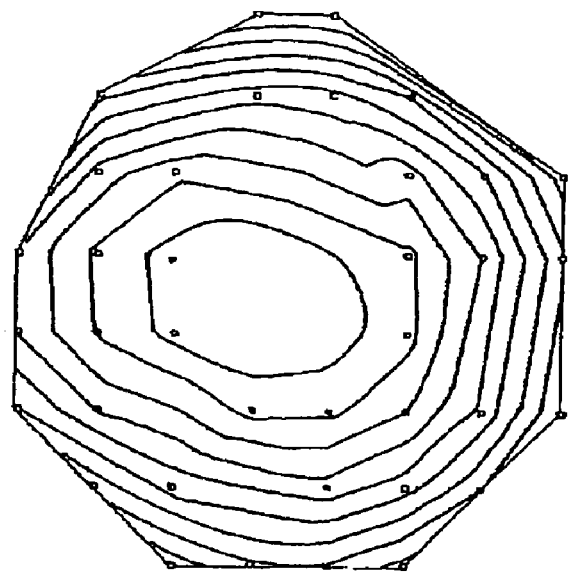
FIG. 20 shows the in-plane distribution of the gate width using a model formula according to embodiment 3 of the present invention.
Figure 21:
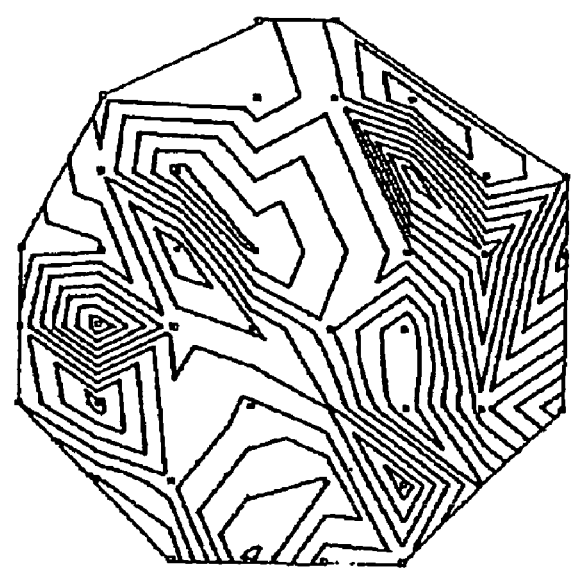
FIG. 21 shows the in-plane distribution of the difference between the fitting value and the measured value according to embodiment 3 of the present invention.
Figure 22:
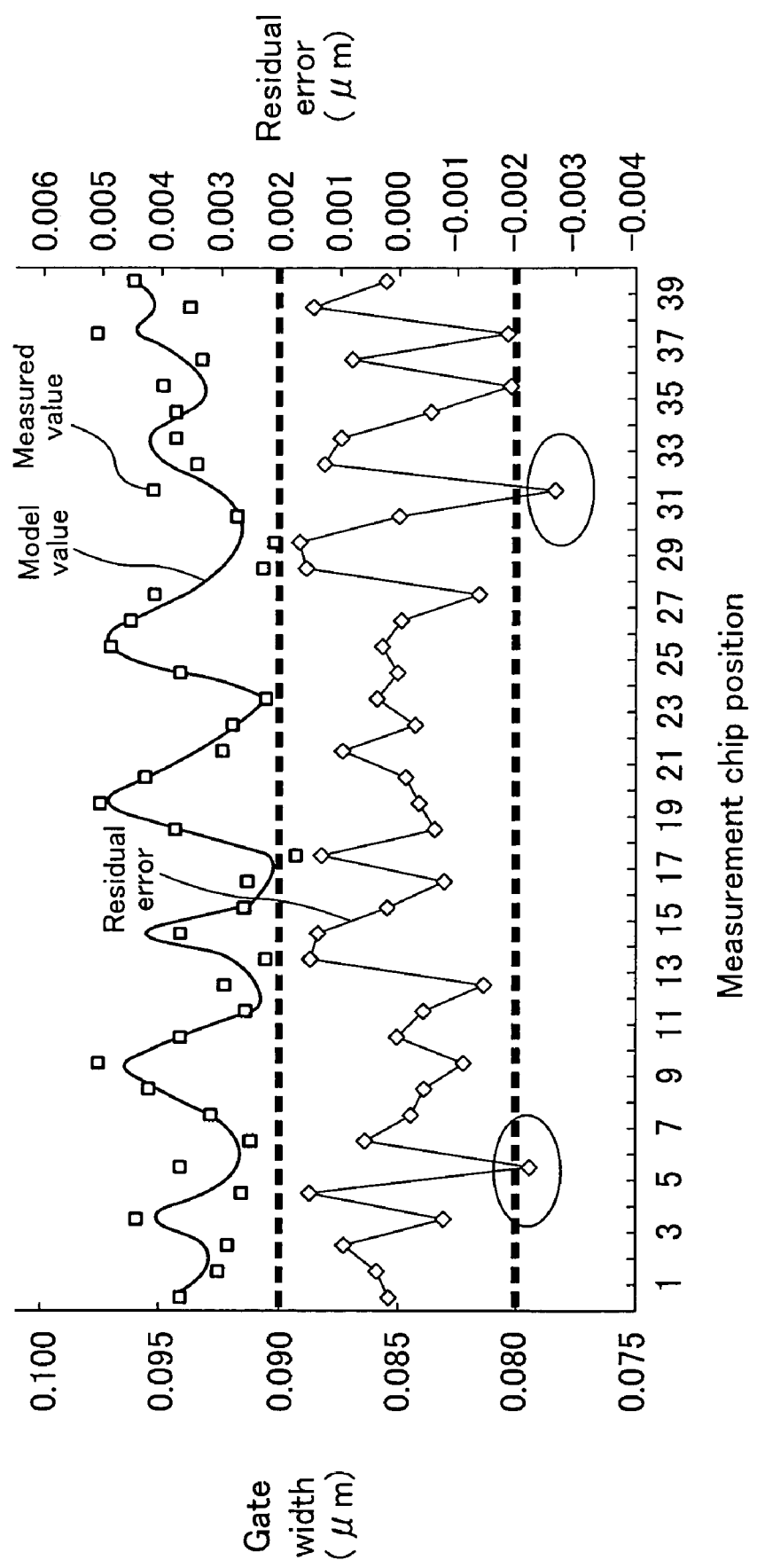
FIG. 22 shows the measurement position dependency of the gate width measured value and the residual error component according to embodiment 3 of the present invention.
Figure 23:
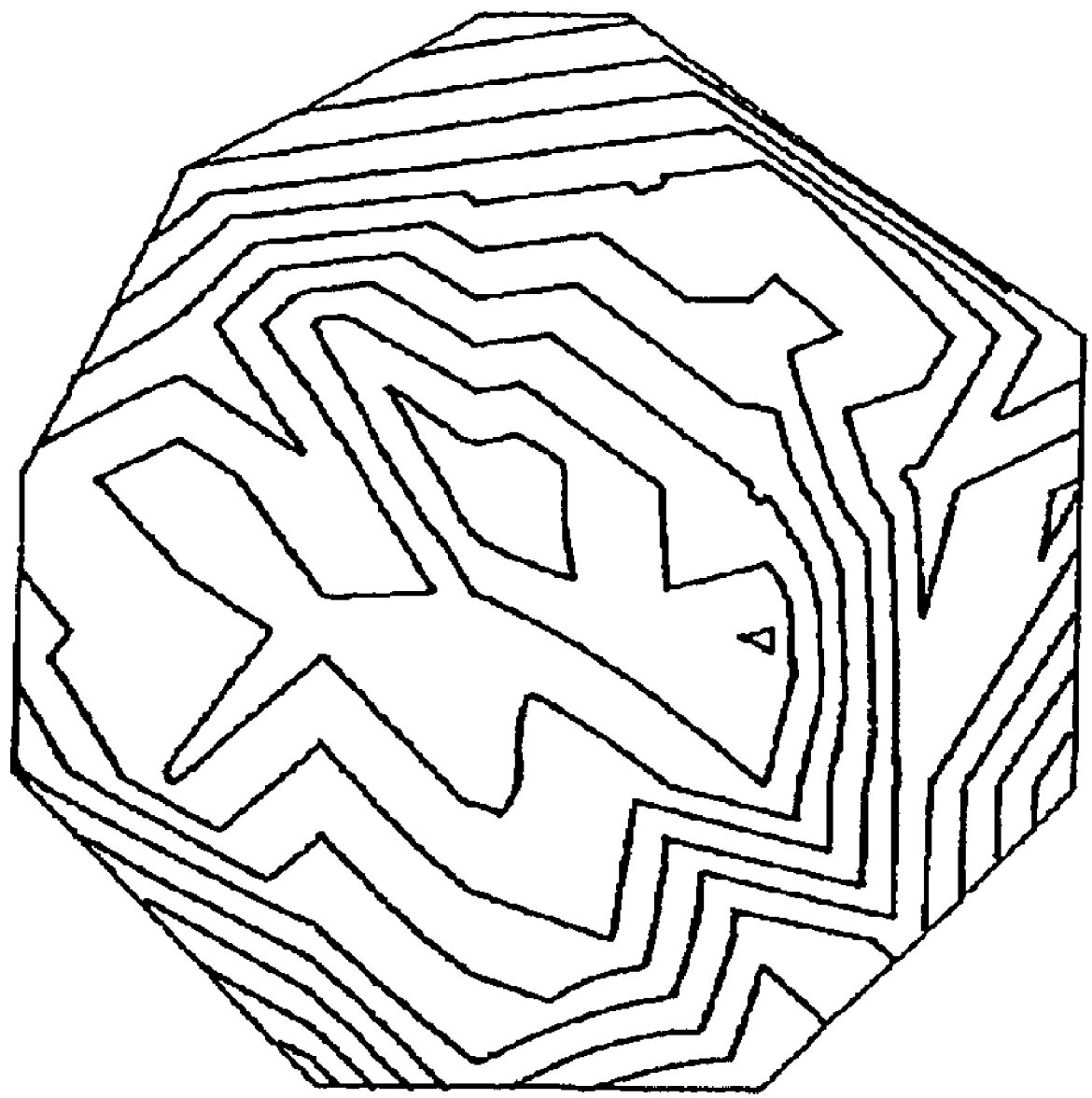
FIG. 23 shows a gate width measurement result obtained after remeasurement according to embodiment 3 of the present invention.

FIG. 17 is a flowchart illustrating the process of improving measurement accuracy and measurement reliability according to embodiment 3. FIG. 18 shows the measurement coordinates over the wafer according to embodiment 3. FIG. 19 shows a measurement result of the gate width according to embodiment 3. FIG. 20 shows the in-plane distribution of the gate width which is obtained by using the model formula according to embodiment 3. FIG. 21 shows the in-plane distribution of the difference between the fitting value and the measured value according to embodiment 3. FIG. 22 shows the measurement position dependency of the measured value of the gate width and the residual error component according to embodiment 3. FIG. 23 shows a gate width measurement result obtained by remeasurement according to embodiment 3.

Hereinafter, embodiment 3 is described with an example of an evaluation result of the in-plane distribution of the gate width.

In the first place, as illustrated in FIG. 17, gate electrodes were formed by etching a wafer. The width of the gate electrode was then measured at the coordinates over the chip shown in FIG. 18. A gate width measurement result measured at this step by a SEM (scanning electron microscope) at the chip positions over the wafer (in 40 chips in total) is shown in FIG. 19. The measured values were applied to model formulas (1) to (3) of the present invention to calculate parameters. The calculated parameters were optimized by the least-squares method such that ERR of formula (4) was minimized. The initial values employed are shown below:

Coefficient of the zeroth order term: $A_0$=0.09365625
Coefficient of the first order term: $A_1$=0
Coefficient of the second order term: $A_2$=0
Shift amount in X direction (chip): $X_0$=0
Shift amount in Y direction (chip): $Y_0$=0
Roundness factor: B (perfect circle at 0.5)=0.5
Rotation factor: $\theta$=0
X-direction tilt coefficient: $A_x$=0
Y-direction tilt coefficient: $A_y$=0

These parameters were optimized as follows:
Coefficient of the zeroth order term: $A_0$=0.107488578
Coefficient of the first order term: $A_1$=−1.95E-03
Coefficient of the second order term: $A_2$=2.43E-04
Shift amount in X direction (chip): $X_0$=−4.23E-01
Shift amount in Y direction (chip): $Y_0$=−1.67E-01
Roundness factor: B (perfect circle at 0.5)=6.48E-01
Rotation factor: $\theta$=−3.87E-01
X-direction tilt coefficient: $A_x$=−1.48E-03
Y-direction tilt coefficient: $A_y$=−2.69E-03

FIG. 20 shows the in-plane distribution of the gate width of the model value reproduced using the above parameters. FIG. 21 shows the wafer in-plane distribution of the residual error value (=(model value)−(measured value)). It is seen from FIG. 21 that the residual error value locally increases. FIG. 22 shows measured values and model values or the residual error of the gate width (vertical axes) with respect to the measurement chip positions (horizontal axis).

At the next step, the coordinates with a large residual error component are specified. That is, measurement data with which the absolute value of the residual error component is equal to or larger than a predetermined value is detected. Comparing the residual error component with the residual error specs of ±0.002 μm indicated by broken lines in FIG. 22, the residual error is out of the specification at encircled chip positions #6 and #32.

In general, the standard error (=(the standard deviation of measured values)/(the number of times of measurement)) which represents the measurement accuracy is inversely proportional to the number of times of measurement. Accordingly, the measurement accuracy improves as the number of times of measurement increases. Thus, measurement is performed again for the above two points (#6 and #32), whereby the measurement accuracy is improved.

After the remeasurement, the average value of the previously-measured value and the remeasured value at the interested chip position is calculated, and the average value is applied to the in-plane distribution model formula to calculate the residual error component again. This process (remeasurement and residual error component calculation) is repeated till a variation in the residual error component disappears, whereby the measurement accuracy is maximized.

In an actual case, a variation of the residual error component or the above-mentioned residual error spec is appropriately set according to the required measurement accuracy.

FIG. 23 shows the in-plane distribution of a remeasured value.

The measurement accuracy for a gate oxide film, or the like, can be improved by using the above-described method of embodiment 3.

Embodiment 4

Embodiment 4 of the present invention is described with reference to FIG. 24.

Figure 24:
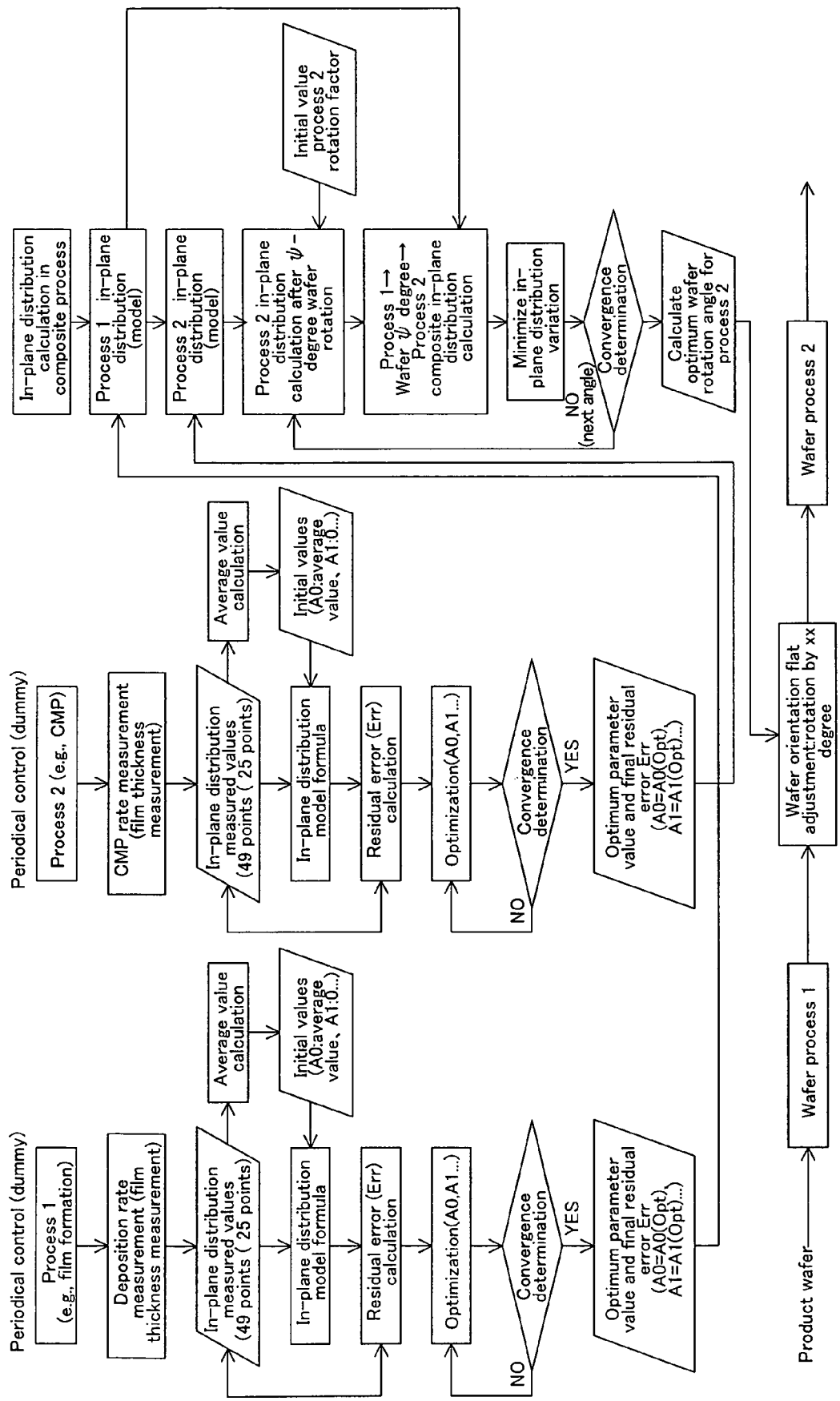
FIG. 24 is a flowchart illustrating the optimization of the in-plane distribution under a composite process according to embodiment 4 of the present invention.

FIG. 24 is a flowchart illustrating the optimization of the in-plane distribution of the film thickness under a composite process according to embodiment 4 of the present invention.

Embodiment 4 is described with an example of an interlayer film formation process and a CMP process of the film. The description is provided with reference to the flowchart of the present invention as shown in FIG. 24.

In the first place, in the interlayer film formation process (process 1), the deposition rate of an interlayer film is modeled.

The steps of the modeling process are as follows:

[1] An interlayer film is formed on a periodically-controlled dummy wafer;

[2] The in-plane distribution of the film thickness (e.g., 49 points) is measured by a film thickness measurement apparatus. The measured in-plane distribution is divided by the deposition time, whereby the deposition rate is calculated;

[3] The average value of the measured values at the measurement points which represent the in-plane distribution of the deposition rate is calculated, and the initial values for the in-plane distribution model formula are determined as follows:
Coefficient of the zeroth order term: $A_0$=Average value
Coefficient of the first order term: $A_1$=0
Coefficient of the second order term: $A_2$=0
Shift amount in X direction (chip): $X_0$=0
Shift amount in Y direction (chip): $Y_0$=0
Roundness factor: B (perfect circle at 0.5)=0.5
Rotation factor: $\theta$=0
X-direction tilt coefficient: $A_x$=0
Y-direction tilt coefficient: $A_y$=0

[4] The initial values, the wafer in-plane coordinates of each measurement point, and the measured value are applied to the in-plane distribution model formulas (formulas (1) to (3));

[5] ERR expressed by formula (4) is calculated;

[6] The above parameters are optimized using the least-squares method such that ERR is minimized;

[7] Convergence is determined. If not yet converged, the process returns to step [6], and the optimization is performed again; and

[8] The optimized parameters which represent the in-plane distribution of the deposition rate of the interlayer film are stored (parameter set 1).

Then, in the CMP process (process 2), a process similar to the above-described process of modeling the deposition rate of the interlayer film is performed, and the optimization is then performed to obtain the parameters which represent the in-plane distribution of the polishing rate (parameter set 2).

As a result, the formulas which represent the in-plane distributions of process 1 and process 2.

Where the formula which represents the in-plane distribution of process 1 is F(x, y) and the formula which represents the in-plane distribution of process 2 is G(x, y), the in-plane distribution obtained when process 1 and process 2 are continuously performed without rotating the position of the orientation flat of the wafer at a time between process 1 and process 2 is expressed as follows:

$$H(x, y) = F(x, y) \times (\text{time of process 1}) + G(x, y) \times (\text{time of process 2}) \quad (5)$$

Where the in-plane distribution obtained when the position of the orientation flat of the wafer is rotated by $\Psi$ degree in process 2 is G'(x, y), and the wafer in-plane coordinates obtained by rotating the coordinates (x, y) over the wafer around the wafer center (0, 0) by $\theta$ degree is (x', y'), G'(x, y) is expressed as G'(x, y)=G(x', y').

That is, the parameters used herein are the same as the following parameters representing the in-plane distribution which are used in formulas (1) and (3) except that rotation factor $\theta$ is changed to $\theta+\Psi$ (degree of rotation for the position of the orientation flat):
Coefficient of the zeroth order term: $A_1$
Coefficient of the first order term: $A_1$
Coefficient of the second order term: $A_2$
Shift amount in X direction: $X_0$
Shift amount in Y direction: $Y_0$
Roundness factor: B
Rotation factor: $\theta$
X-direction tilt coefficient: $A_x$
Y-direction tilt coefficient: $A_y$ That is, G'=G except $\theta \rightarrow \theta+\Psi$.

After the rotation by $\Psi$ degree, H(x, y) of formula (5) is expressed as follows:

$$H'(x, y) = F(x, y) \times (\text{time of process 1}) + G'(x, y) \times (\text{time of process 2}) \quad (6)$$
$$= F(x, y) \times (\text{time of process 1}) + G(x, y) [\text{except } \theta \rightarrow \theta + \Psi] \times (\text{time of process 2})$$

Lastly, the flowchart of FIG. 24 is referred to again to describe calculation of the in-plane distribution of the composite process on a step-by-step basis:

[1] The stored parameters which represent the in-plane distributions of process 1 and process 2 are extracted;

[2] The in-plane distribution of the composite process is calculated based on formula (6);

[3] The in-plane variation is calculated;

[4] The value of $\Psi$ is optimized using the least-squares method such that the in-plane variation becomes minimum;

[5] Convergence is determined. If not yet converged, the process returns to step [2];

[6] Optimum orientation flat rotation angle Ψ is stored; and

[7] Stored angle Ψ is fed back to a wafer orientation flat adjustment device which is used between process 1 and process 2.

Embodiment 5

Embodiment 5 is described with reference to FIGS. 25 to 29.

Figure 25:
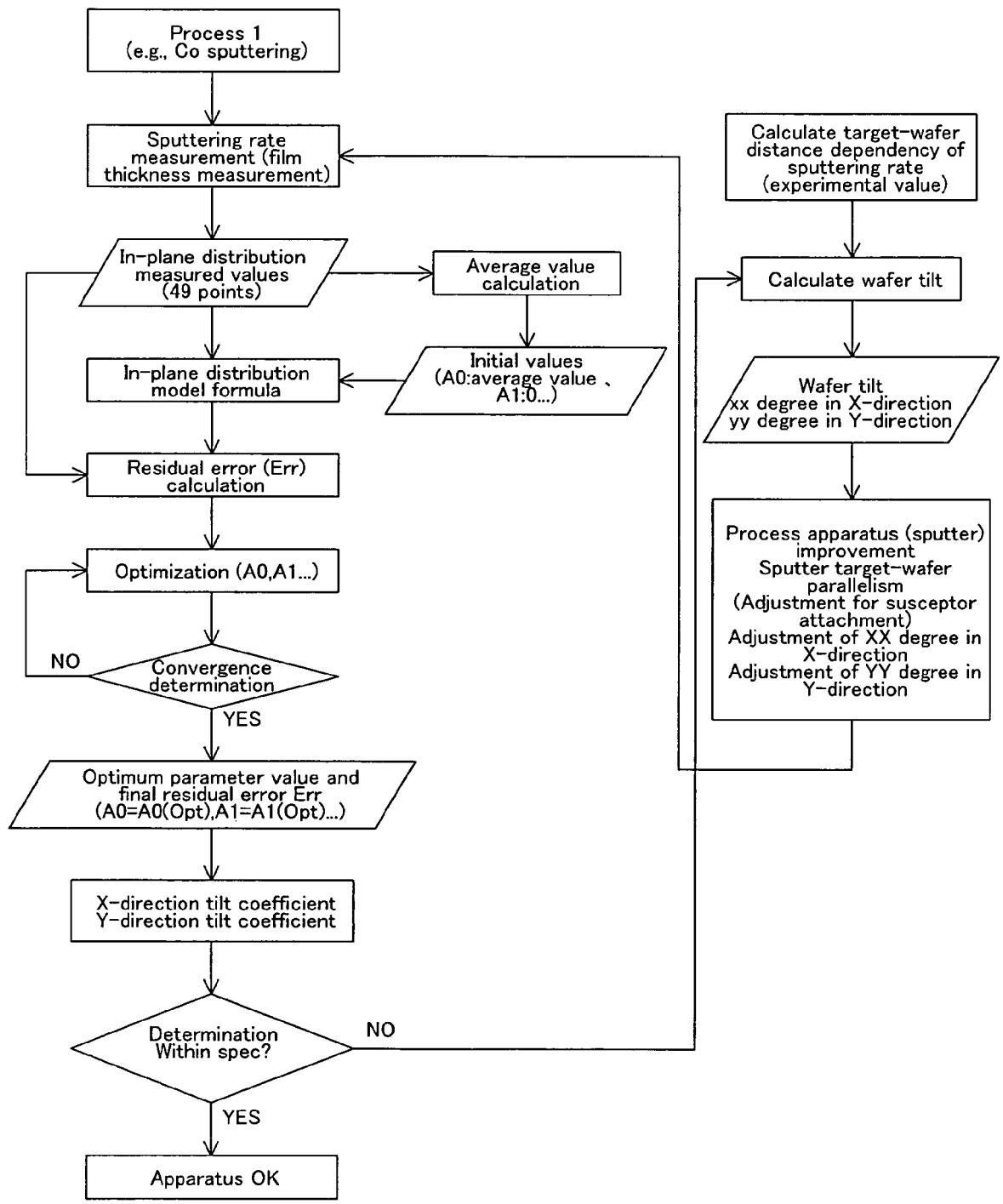
FIG. 25 is a flowchart of a method for improving a process apparatus according to embodiment 5 of the present invention.
Figure 26:
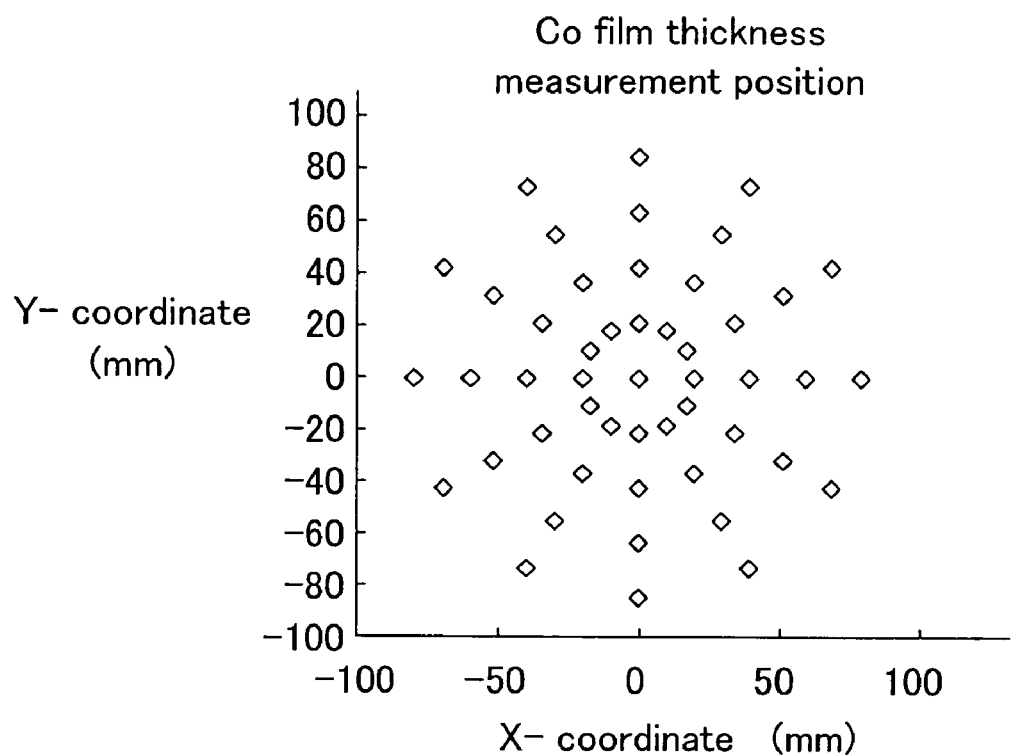
FIG. 26 shows measurement positions for the in-plane distribution of the thickness of a cobalt film according to embodiment 5 of the present invention.
Figure 27:
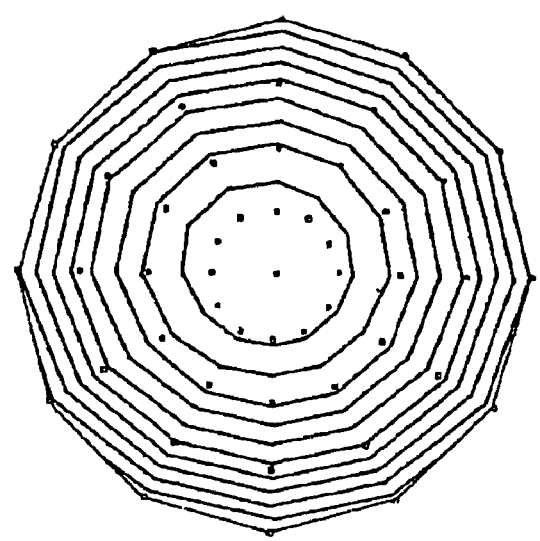
FIG. 27 shows the in-plane distribution of the thickness of a cobalt film according to embodiment 5 of the present invention.
Figure 28:
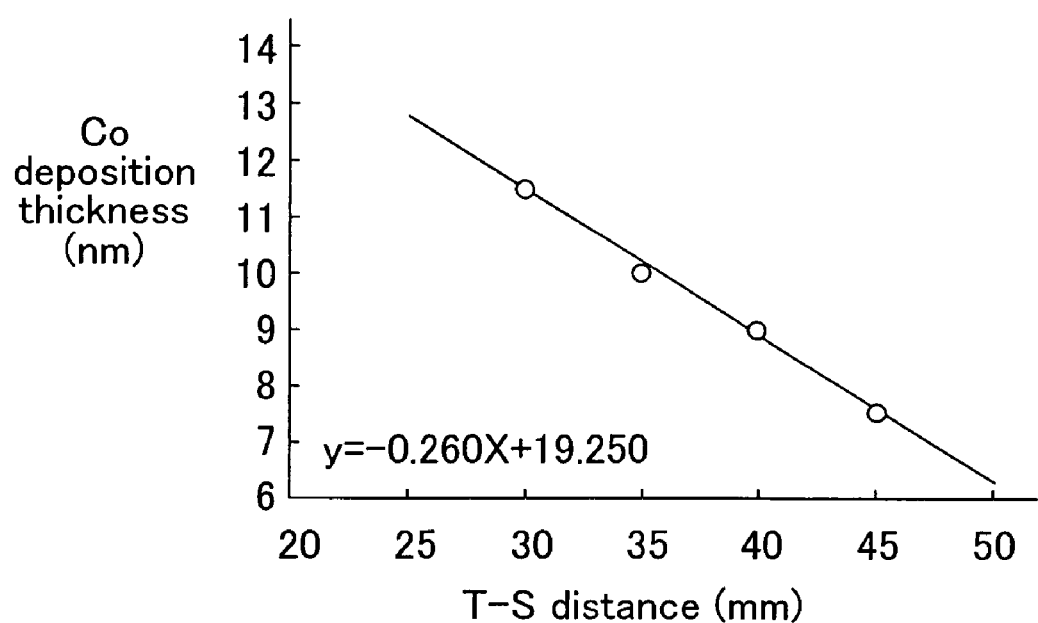
FIG. 28 shows the relationship between the thickness of a cobalt film and the target-substrate distance according to embodiment 5 of the present invention.
Figure 29:
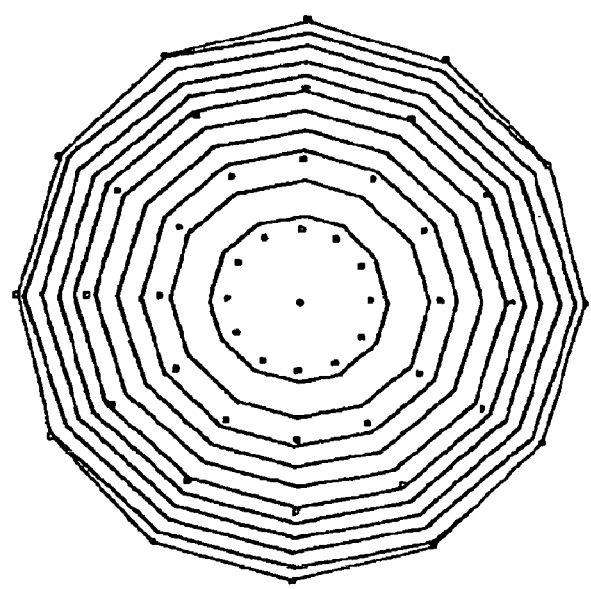
FIG. 29 shows the in-plane distribution of the thickness of a cobalt film formed after an improvement of a process apparatus according to embodiment 5 of the present invention.
Figure 30:
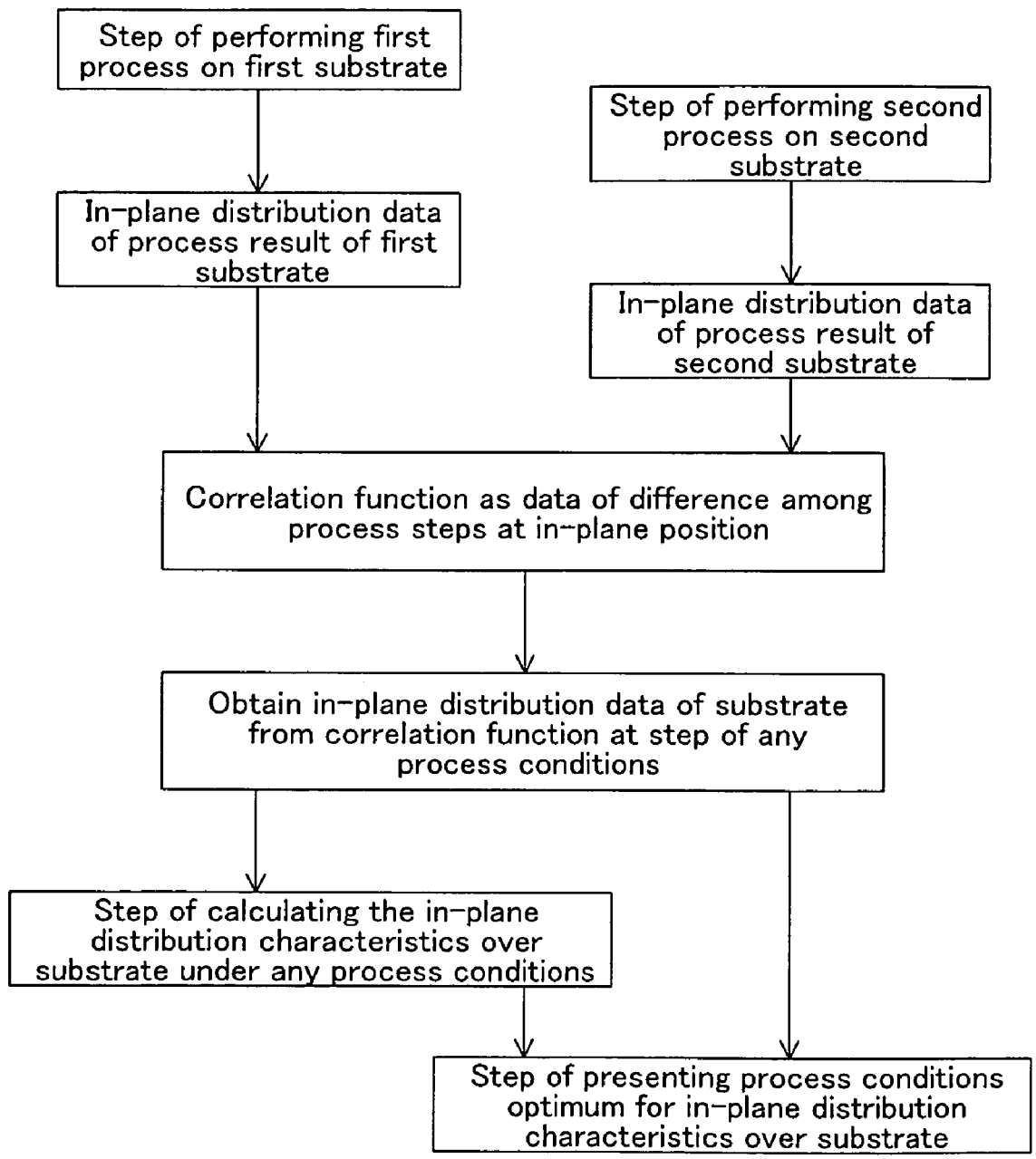
FIG. 30 is a flowchart illustrating a conventional measurement method.

FIG. 25 is a flowchart illustrating a method for improving a process apparatus according to embodiment 5. FIG. 26 shows the measurement positions for the in-plane distribution of the thickness of a cobalt film according to embodiment 5. FIG. 27 shows the in-plane distribution of the thickness of the cobalt film according to embodiment 5. FIG. 28 shows the relationship between the thickness of the cobalt film and the target-substrate distance according to embodiment 5. FIG. 29 shows the in-plane distribution of the thickness of a cobalt film formed after improvement of the process apparatus according to embodiment 5.

The process apparatus improvement method of embodiment 5 which is illustrated in the flowchart of FIG. 25 is described with an example of a cobalt sputtering apparatus.

[1] The in-plane distribution of the thickness of a cobalt film deposited after maintenance is measured using a monitor wafer at the measurement positions shown in FIG. 26. The measurement result is shown in FIG. 27;

[2] The average value of the measured values is calculated, and the initial values of the parameters used in the model formulas are set;

[3] The coordinates of the measurement positions and the measured values are applied to the model formulas (formulas (1) to (3));

[4] Residual error ERR represented by formula (4) is calculated;

[5] The parameters which minimize ERR are calculated using the least-squares method;

[6] Convergence is determined. If not yet converged, the optimization is performed again; and

[7] The optimized parameters are stored.

In the case of the wafer in-plane distribution shown in FIG. 27, the parameters obtained when converged are as follows:

Coefficient of the zeroth order term: $A_0$=9.88E+00
Coefficient of the first order term: $A_1$=2.16E-04
Coefficient of the second order term: $A_2$=-8.26E-05
Shift amount in X direction (chip): $X_0$=5.30E-04
Shift amount in Y direction (chip): $Y_0$=8.20E-05
Roundness factor: B (perfect circle at 0.5)=5.39E-01
Rotation factor: θ=2.13E-01
X-direction tilt coefficient: $A_x$=-7.44E-04
Y-direction tilt coefficient: $A_y$=1.51E-03

[8] It is determined whether or not the X-direction tilt coefficient and the Y-direction tilt coefficient are within the specification (predetermined range). In this case, the specification of the X-direction tilt coefficient and the Y-direction tilt coefficient is equal to or greater than -2.5E-4 and equal to or smaller than 2.5E-4. Thus, it is determined that these factors are out of the specification.

FIG. 28 shows a change in the cobalt film thickness wherein the cobalt films are formed with different intervals between the target and the wafer based on the same recipe. As seen from FIG. 28, the thickness of the cobalt film increases by 0.26 nm as the T-S interval decreases by 1 mm.

[9] Actual tilt of the wafer (susceptor) is obtained from this change value and the obtained X-direction tilt coefficient and Y-direction tilt coefficient.

The tilt amount at an end of the wafer X-axis ($H_x$) can be expressed as $A_x$×100 mm (radius of wafer)/0.26 (nm/mm). Thus, the tilt of the wafer in X direction is calculated to be Tan($H_x$/100)×180/3.14 degrees, i.e., -0.16°. Likewise, the tilt of the wafer in Y direction is calculated to be 0.33°.

[10] The position and angle at which a wafer stage is attached are externally adjustable. The wafer stage is adjusted by -0.16° in X-direction and 0.33° in Y-direction.

[11] Cobalt is again deposited over the monitor wafer, and the thickness of the cobalt film is measured. FIG. 29 shows the wafer in-plane distribution of the thickness of the cobalt film deposited after the adjustments of the attachment position and angle of the stage.

As seen from FIG. 29, the tilted in-plane distribution over the wafer, which is shown is FIG. 27, has been ameliorated.

Further, the in-plane variation has also been improved to a value equal to or smaller than that obtained before the maintenance.

[12] This measured value is again applied to the model formula to obtain the X-direction tilt coefficient and the Y-direction tilt coefficient.

[13] At this time, these values are substantially equal to 0 and are within the specification. Thus, it is determined that the maintenance has been completed.

Likewise, even in an etching apparatus or CMP apparatus, the parallelism of a susceptor and a wafer surface facing thereon are adjustable using the tilt of the wafer which is determined based on the in-plane distribution over a monitor wafer within a short period of time without opening a chamber to atmosphere or using a special jig.

As described above, according to an in-plane distribution data compression method of the present invention, only 9 factors for respective terms of the model formula of the present invention are stored, although it is conventionally necessary to store data of all the measurement points. With such a structure, the accuracy equivalent to that obtained when measured values of all the 49 measurement points are stored is achieved as described in embodiment 5. Thus, the amount of measurement data can be compressed to about a ⅕ in the control of a semiconductor production line. Because of an increase in the diameter of a semiconductor wafer, it is necessary to increase the number of measurement points in multi-point measurement in order to evaluate the wafer in-plane distribution with accuracy equal to the conventional accuracy. Thus, the data compression effect of the present invention is more effective as the number of measurement points over a semiconductor substrate increases. Furthermore, when in-plane distribution wafer map is provided, a value at a desired position on a wafer can be obtained only by selecting the coordinates.

According to a process control method of the present invention, the wafer in-plane distribution is evaluated and controlled using the present invention, whereby the in-plane distribution can be quantitatively evaluated. Furthermore, the frequency, level, and position of the apparatus maintenance can be accurately estimated by evaluating the above-described parameters, the value of ERR, and the in-plane distribution of the fitting residual error ((fitting value)−(measured value)).

According to an in-plane distribution measurement method of the present invention, measurement data at a singular point is remeasured, whereby it is possible to improve the measurement accuracy for the gate width and the thickness of a thin film whose specifications are strictly controlled.

According to an in-plane distribution optimization method of the present invention, the wafer angle is optimized between the first and second processes based on the in-plane distributions of the first and second processes, and accordingly, the in-plane distribution obtained after the second process can be optimized.

According to a process apparatus control method of the present invention, the maintenance time can be shortened. Furthermore, unnecessary maintenance is omitted, whereby occurrence of a great change in the apparatus conditions between a pre-maintenance state and a post-maintenance state can be avoided. As a result, the control accuracy can be improved.

What is claimed is:

1. A process control method used in a production process of a semiconductor device, comprising the steps of:
    performing a process over a substrate;
    measuring an in-plane distribution over the substrate;
    calculating a model formula of the in-plane distribution from measurement data obtained by measurement;
    comparing the measurement data with the model formula to calculate a set of parameters of the model formula;
    storing the parameters as data of the in-plane distribution over the substrate;
    comparing the measurement data with the model formula to detect measurement data which is inconsistent with the model formula;
    performing remeasurement for the inconsistent measurement data to update the inconsistent measurement data; and
    determining an abnormality in a semiconductor device production apparatus from a variation in the stored parameters,
    wherein the measurement data includes measurement coordinates over the substrate, and
    the model formula is obtained by modeling the tendency that the in-plane distribution concentrically varies and the tendency that the in-plane distribution varies along a diameter direction and along a tilt of the substrate.

2. The process control method of claim 1, wherein the model formula is expressed as follows:

$$F(x, y) = A_0 + A_1 R + A_2 R^2 + A_x x + A_y y$$

where $F(x, y)$ is a measured value at a point $(x, y)$ over the substrate, $A$ is a coefficient of the zeroth order term, $A_1$ is a coefficient of the first order term, $A_2$ is a coefficient of the second order term, $R$ is a roundness factor, $A_x$ is a X-direction tilt coefficient, and $A_y$ is a Y-direction tilt factor.

3. The process control method of claim 1, wherein in the model formula, centers of concentric circles in the in-plane distribution do not correspond to each other.

4. The process control method of claim 3, wherein a point $(x, y)$ over the substrate is rotated by $\theta$ degree with respect to X-Y coordinate of the substrate.

5. The process control method of claim 4, wherein the point rotated by $\theta$ degree is expressed by the following formula:

$$X = x \cos\theta - y \cos\theta, \ Y = x \sin\theta + y \cos\theta.$$

6. The process control method of claim 1, wherein the model formula is expressed by the following formulas:

$$F(x, y) = A_0 + A_1 R + A_2 R^2 + A_x x + A_y y$$

$$R = (X - X_0)^2 / B + (Y - Y_0)^2 / (1 - B)$$

where $F(x, y)$ is a measured value at a point $(x, y)$ over the substrate, $A$ is a coefficient of the zeroth order term, $A_1$ is a coefficient of the first order term, $A_2$ is a coefficient of the second order term, $R$ is a roundness factor, $A_x$ is a X-direction tilt coefficient, $A_y$ is a Y-direction tilt factor, $X_0$ is a shift amount in X direction, $Y_0$ is a shift amount in Y direction, and $\theta$ is a rotation factor.

7. A process control method used in a production process of a semiconductor device, comprising the steps of:
    performing a process over a substrate;
    measuring an in-plane distribution over the substrate;
    calculating a model formula of the in-plane distribution from measurement data obtained by measurement;
    comparing the measurement data with the model formula to calculate a set of parameters of the model formula;
    storing the parameters as data of the in-plane distribution over the substrate; and
    determining an abnormality in a semiconductor device production apparatus from a variation in the stored parameters,
    wherein the measurement data includes measurement coordinates over the substrate, and
    the model formula is obtained by modeling the tendency that the in-plane distribution concentrically varies and the tendency that the in-plane distribution varies along a diameter direction,
    wherein the step of performing over the substrate is a step of performing a first process over the substrate;
    the step of measuring an in-plane distribution over the substrate is a step of measuring an in-plane distribution A over the substrate;
    the step of calculating the model formula of the in-plane distribution from measurement data obtained by measurement is a step of calculating a model formula A of the in-plane distribution A from measurement data A obtained by measurement;
    the step of comparing the measurement data with the model formula to calculate the set of parameters of the model formula is a step of comparing the measurement data A with the model formula A to calculate a set of parameters A of the model formula A; and
    the step of storing the parameters as data of the in-plane distribution over the substrate is a step of storing the parameters A as data A of the in-plane distribution A over the substrate,
    wherein the process control method further comprises the steps of:
        performing a second process over the substrate;
        measuring an in-plane distribution B over the substrate;
        calculating a model formula B of the in-plane distribution B from measurement data B obtained by measurement;
        comparing the measurement data B with the model formula B to calculate a set of parameters B of the model formula B;
        storing the parameters B as data B of the in-plane distribution B over the substrate;
        comparing the in-plane distribution A and the in-plane distribution B based on the data A and the data B to calculate a correction value such that the uniformity of the in-plane distribution B in the second process improves; and
        adjusting wafer orientation based on the correction value,
    wherein the measurement data A and the measurement data B include measurement coordinates over the substrate, and the model formula A and the model formula B are obtained by modeling the tendency that the in-plane distribution A and the in-plane distribution B concentrically vary and the tendency that the in-plane distribution A and the in-plane distribution B vary along a diameter direction.

8. A process control method used in a production process of a semiconductor device, comprising the steps of:
performing a process over a substrate;
measuring an in-plane distribution over the substrate;
calculating a model formula of the in-plane distribution from measurement data obtained by measurement;
comparing the measurement data with the model formula to calculate a set of parameters of the model formula;
storing the parameters as data of the in-plane distribution over the substrate; and
determining an abnormality in a semiconductor device production apparatus from a variation in the stored parameters,
wherein the measurement data includes measurement coordinates over the substrate,
the model formula is obtained by modeling the tendency that the in-plane distribution concentrically varies and the tendency that the in-plane distribution varies along a diameter direction and along a tilt of the substrate,
in the model formula, centers of concentric circles in the in-plane distribution do not correspond to each other, and
a point (x, y) over the substrate is rotated by θ degree with respect to X-Y coordinate of the substrate.

9. The process control method of claim 8, wherein the point rotated by θ degree is expressed by the following formula:

$$X = x \cos\theta - y \cos\theta,\ Y = x \sin\theta + y \cos\theta.$$

10. A process control method used in a production process of a semiconductor device, comprising the steps of:
performing a first process over a substrate;
measuring an in-plane distribution A over the substrate;
calculating a model formula A of the in-plane distribution A from measurement data A obtained by measurement;
comparing the measurement data A with the model formula A to calculate a set of parameters A of the model formula A;
storing the parameters A as data A of the in-plane distribution A over the substrate;
comparing the measurement data A with the model formula A to detect measurement data A which is inconsistent with the model formula A;
performing remeasurement for the inconsistent measurement data A to update the inconsistent measurement data A; and
determining an abnormality in a semiconductor device production apparatus from a variation in the stored parameters,
wherein the measurement data includes measurement coordinates over the substrate, and
the model formula is obtained by modeling the tendency that the in-plane distribution concentrically varies and the tendency that the in-plane distribution varies along a diameter direction,
wherein the process control method further comprises the steps of:
performing a second process over the substrate;
measuring an in-plane distribution B over the substrate;
calculating a model formula B of the in-plane distribution B from measurement data B obtained by measurement;
comparing the measurement data B with the model formula B to calculate a set of parameters B of the model formula B;
storing the parameters B as data B of the in-plane distribution B over the substrate;
comparing the measurement data B with the model formula B to detect measurement data B which is inconsistent with the model formula B;
performing remeasurement for the inconsistent measurement data B to update the inconsistent measurement data B; and
comparing the in-plane distribution A and the in-plane distribution B based on the data A and the data B to calculate a correction value such that the uniformity of the in-plane distribution B in the second process improves,
wherein the measurement data A and the measurement data B include measurement coordinates over the substrate, and
the model formula A and the model formula B are obtained by modeling the tendency that the in-plane distribution A and the in-plane distribution B concentrically vary and the tendency that the in-plane distribution A and the in-plane distribution B vary along a diameter direction.

11. A process control method used in a production process of a semiconductor device, comprising the steps of:
performing a process over a substrate;
measuring an in-plane distribution over the substrate;
calculating a model formula of the in-plane distribution from measurement data obtained by measurement;
comparing the measurement data with the model formula to calculate a set of parameters of the model formula;
storing the parameters as data of the in-plane distribution over the substrate; and
determining an abnormality in a semiconductor device production apparatus from a variation in the stored parameters; and
performing remeasurement for inconsistent measurement data detected by the comparison of the measurement data with the model formula to update the inconsistent measurement data,
wherein the measurement data includes measurement coordinates over the substrate,
the model formula is obtained by modeling the tendency that the in-plane distribution concentrically varies and the tendency that the in-plane distribution varies along a diameter direction and along a tilt of the substrate,
in the model formula, centers of concentric circles in the in-plane distribution do not correspond to each other, and
the model formula is expressed by the following formulas:

$$F(x, y) = A_0 + A_1 R + A_2 R^2 + A_x x + A_y y$$

$$R = (X - X_0)^2 / B + (Y - Y_0)^2 / (1 - B)$$

where F(x, y) is a measured value at a point (x, y) over the substrate, A is a coefficient of the zeroth order term, $A_1$ is a coefficient of the first order term, $A_2$ is a coefficient of the second order term, R is a roundness factor, $A_x$ is a X-direction tilt coefficient, $A_y$ is a Y-direction tilt factor, $X_0$ is a shift amount in X direction, $Y_0$ is a shift amount in Y direction, and θ is a rotation factor.

12. A process control method used in a production process of a semiconductor device, comprising the steps of:
performing a process over a substrate;

measuring an in-plane distribution over the substrate;
calculating a model formula of the in-plane distribution from measurement data obtained by measurement;
comparing the measurement data with the model formula to calculate a set of parameters of the model formula;
storing the parameters as data of the in-plane distribution over the substrate;
determining an abnormality in a semiconductor device production apparatus from a variation in the stored parameters; and
outputting the determination result of the abnormality in the semiconductor device production apparatus,
wherein the measurement data includes measurement coordinates over the substrate, and
the model formula is obtained by modeling the tendency that the in-plane distribution concentrically varies and the tendency that the in-plane distribution varies along a diameter direction and along a tilt of the substrate.

13. The process control method of claim 12, wherein the model formula is expressed as follows:

$$F(x, y) = A_0 + A_1 R + A_2 R^2 + A_x x + A_y y$$

where $F(x, y)$ is a measured value at a point $(x, y)$ over the substrate, $A$ is a coefficient of the zeroth order term, $A_1$ is a coefficient of the first order term, $A_2$ is a coefficient of the second order term, $R$ is a roundness factor, $A_x$ is a X-direction tilt coefficient, and $A_y$ is a Y-direction tilt factor.

14. The process control method of claim 12, wherein in the model formula, centers of concentric circles in the in-plane distribution do not correspond to each other.

15. The process control method of claim 12, wherein the model formula is expressed by the following formulas:

$$F(x, y) = A_0 + A_1 R + A_2 R^2 + A_x x + A_y y$$

$$R = (X - X_0)^2 / B + (Y - Y_0)^2 / (1 - B)$$

where $F(x, y)$ is a measured value at a point $(x, y)$ over the substrate, $A$ is a coefficient of the zeroth order term, $A_1$ is a coefficient of the first order term, $A_2$ is a coefficient of the second order term, $R$ is a roundness factor, $A_x$ is a X-direction tilt coefficient, $A_y$ is a Y-direction tilt factor, $X_0$ is a shift amount in X direction, $Y_0$ is a shift amount in Y direction, and $\theta$ is a rotation factor.

* * * * *